US010868213B2

(12) United States Patent
Armitage et al.

(10) Patent No.: US 10,868,213 B2
(45) Date of Patent: Dec. 15, 2020

(54) LED UTILIZING INTERNAL COLOR CONVERSION WITH LIGHT EXTRACTION ENHANCEMENTS

(71) Applicant: Lumileds LLC, San Jose, CA (US)

(72) Inventors: Robert David Armitage, San Jose, CA (US); Isaac Harshman Wildeson, San Jose, CA (US); Parijat Pramil Deb, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/018,883

(22) Filed: Jun. 26, 2018

(65) Prior Publication Data

US 2019/0393379 A1 Dec. 26, 2019

(51) Int. Cl.
| | |
|---|---|
| *H01L 33/10* | (2010.01) |
| *H01L 33/00* | (2010.01) |
| *H01L 33/50* | (2010.01) |
| *H01L 33/46* | (2010.01) |
| *H01L 33/08* | (2010.01) |

(52) U.S. Cl.
CPC .......... *H01L 33/10* (2013.01); *H01L 33/0008* (2013.01); *H01L 33/0062* (2013.01); *H01L 33/08* (2013.01); *H01L 33/46* (2013.01); *H01L 33/50* (2013.01)

(58) Field of Classification Search
CPC ...................................................... H01L 33/10
See application file for complete search history.

(56) References Cited

U.S. PATENT DOCUMENTS

| | | | | |
|---|---|---|---|---|
| 5,132,750 A | * | 7/1992 | Kato | H01L 33/10 |
| | | | | 257/13 |
| 5,428,634 A | * | 6/1995 | Bryan | B82Y 20/00 |
| | | | | 372/45.01 |
| 5,696,389 A | * | 12/1997 | Ishikawa | H01L 33/20 |
| | | | | 257/99 |
| 5,793,062 A | * | 8/1998 | Kish, Jr. | H01L 33/10 |
| | | | | 257/98 |

(Continued)

FOREIGN PATENT DOCUMENTS

JP   2003-197969 A   7/2003

OTHER PUBLICATIONS

Damilano et al., "Monolithic white light emitting diodes using a (Ga,In)N-based light converter," Article in Proceedings of SPIE—The International Society for Optical Engineering (Feb. 2014).

(Continued)

*Primary Examiner* — William A Harriston

(57) ABSTRACT

A light emitting diode (LED) device may include an n-type layer formed on a transparent substrate. A photoluminescent (PL) in the n-type layer quantum well (QW) and an electroluminescent (EL) QW may be formed on the n-type layer. The PL QW and the EL QW may be separated from one another by a portion of the n-type layer. A p-type layer may be formed on the EL QW. Trenches may be formed extending into the n-type layer, the trenches defining an emitting area. A passivation material may be formed on sidewalls of the trenches and n-type contacts may be formed therein. A p-type contact may be formed on an upper surface of the p-type layer. A dichroic mirror may be formed on at least a lower surface of the transparent substrate.

21 Claims, 25 Drawing Sheets

(56) References Cited

U.S. PATENT DOCUMENTS

| | | | | |
|---|---|---|---|---|
| 6,552,754 | B1* | 4/2003 | Song | H04N 9/3129 348/750 |
| 6,621,842 | B1* | 9/2003 | Dapkus | B82Y 20/00 372/45.01 |
| 6,792,026 | B2* | 9/2004 | Henrichs | H01S 5/18358 372/43.01 |
| 7,141,445 | B2* | 11/2006 | Sugawara | H01L 33/30 438/41 |
| 7,202,506 | B1* | 4/2007 | DenBaars | H01L 33/08 257/89 |
| 7,283,577 | B2* | 10/2007 | Schmid | H01S 5/18308 372/99 |
| 8,470,618 | B2* | 6/2013 | Massies | H01L 33/08 438/22 |
| 8,740,400 | B2* | 6/2014 | Tao | F21V 33/0052 362/84 |
| 8,748,923 | B2* | 6/2014 | Krames | H01L 33/0093 257/98 |
| 8,829,546 | B2* | 9/2014 | DenBaars | H01L 33/025 257/103 |
| 10,263,149 | B2* | 4/2019 | Samuelson | B82Y 10/00 |
| 2002/0041148 | A1* | 4/2002 | Cho | H01L 27/15 313/499 |
| 2002/0139984 | A1* | 10/2002 | Sugawara | H01L 33/08 257/79 |
| 2003/0231680 | A1* | 12/2003 | Burak | B82Y 20/00 372/45.01 |
| 2004/0013155 | A1* | 1/2004 | Burak | H01S 5/3235 372/96 |
| 2004/0041161 | A1* | 3/2004 | Kim | H01L 33/08 257/80 |
| 2004/0263045 | A1* | 12/2004 | Smith | H01L 27/3211 313/373 |
| 2006/0054905 | A1* | 3/2006 | Schwach | H01L 33/20 257/89 |
| 2008/0029773 | A1* | 2/2008 | Jorgenson | H01L 33/105 257/94 |
| 2008/0159344 | A1* | 7/2008 | Penn | H01S 5/141 372/23 |
| 2008/0179609 | A1 | 7/2008 | Trottier et al. | |
| 2009/0034977 | A1* | 2/2009 | Tan | H04J 14/02 398/82 |
| 2009/0207873 | A1* | 8/2009 | Jansen | H01S 5/183 372/50.12 |
| 2009/0296752 | A1* | 12/2009 | Giaretta | H01S 5/141 372/20 |
| 2010/0025712 | A1* | 2/2010 | Weyers | H01L 33/08 257/98 |
| 2010/0117997 | A1* | 5/2010 | Haase | H01L 33/28 345/204 |
| 2010/0207136 | A1* | 8/2010 | Armitage | H01L 21/0242 257/94 |
| 2011/0045623 | A1 | 2/2011 | Massies et al. | |
| 2011/0069729 | A1* | 3/2011 | Strittmatter | B82Y 20/00 372/45.01 |
| 2011/0256648 | A1* | 10/2011 | Kelley | H01L 33/08 438/29 |
| 2011/0260601 | A1* | 10/2011 | Leatherdale | H01L 33/08 313/483 |
| 2012/0001204 | A1 | 1/2012 | Jagt | |
| 2012/0049236 | A1 | 3/2012 | Kamiya et al. | |
| 2012/0119237 | A1* | 5/2012 | Leatherdale | H01L 27/156 257/88 |
| 2013/0016746 | A1* | 1/2013 | Strittmatter | H01S 5/34333 372/29.015 |
| 2014/0191220 | A1* | 7/2014 | Watabe | H01L 51/0074 257/40 |
| 2017/0062680 | A1 | 3/2017 | Yoo et al. | |
| 2018/0090645 | A1* | 3/2018 | Nelson | H01L 33/32 |
| 2019/0221993 | A1* | 7/2019 | Hammond | H01S 5/0206 |

OTHER PUBLICATIONS

Dorsaz et al., "Selective oxidation of AlInN layers for current confinement in III-nitride devices," Appl. Phys. Lett. 87, 072102 (2005).

Kowsz et al., "Using band engineering to tailor the emission spectra of trichromatic semipolar InGaN light-emitting diodes for phosphor-free polarized white light emission," Journal of Applied Physics 120, 033102 (2016).

Schiavon et al., "Optically pumped GaInN/GaN multiple quantum wells for the realization of efficient green light-emitting devices," Appl. Phys. Lett. 102, 113509 (2013).

Shen et al., "Optical cavity effects in InGaNÕGaN quantum-well-heterostructure flip-chip light-emitting diodes," Applied Physics Letters, vol. 82, No. 14 (Apr. 7, 2003).

Sheu et al., "GaN-based photon-recycling green light emitting diodes with vertical-conduction structure," Article In Optics Express (Apr. 2015).

Verzellesi et al. "Efficiency droop in InGaN/GaN blue light-emitting diodes: Physical mechanisms and remedies," Journal of Applied Physics. 114, 071101 (2013).

Zhang et al., "Mesoporous GaN for Photonic Engineering—Highly Reflective GaN Mirrors as an Example," American Chemical Society Publications, ACS Photonics (Jun. 18, 2015).

International Search Report, corresponding to PCT/US2019/038717, dated Aug. 29, 2019, 1 page.

Written Opinion of the EPO acting as the International Searching Authority, corresponding to PCT/US2019/038717, dated Aug. 29, 2019, 7 pages.

Extended European Search Report, Apr. 25, 2019, 10 pages.

* cited by examiner

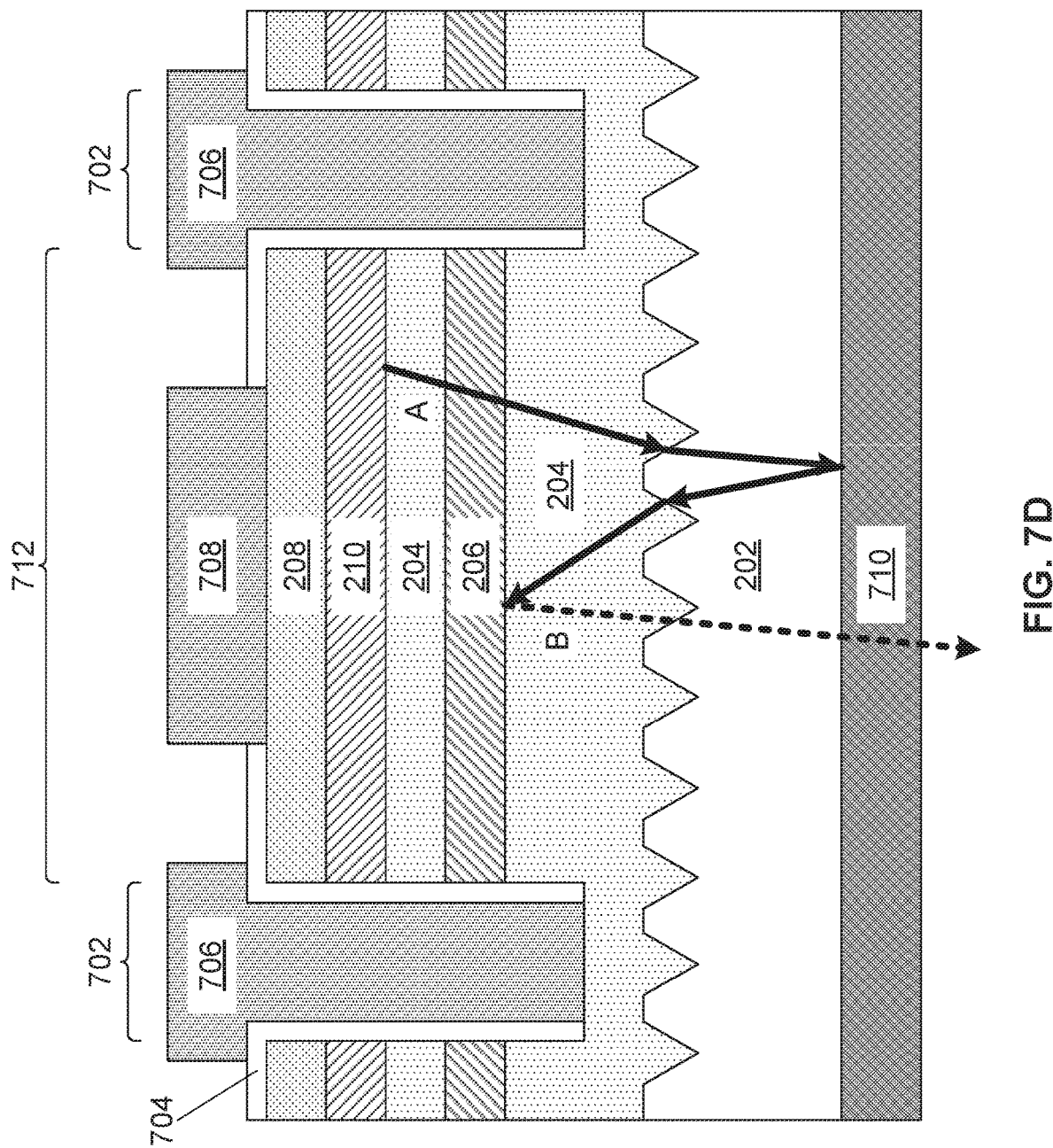

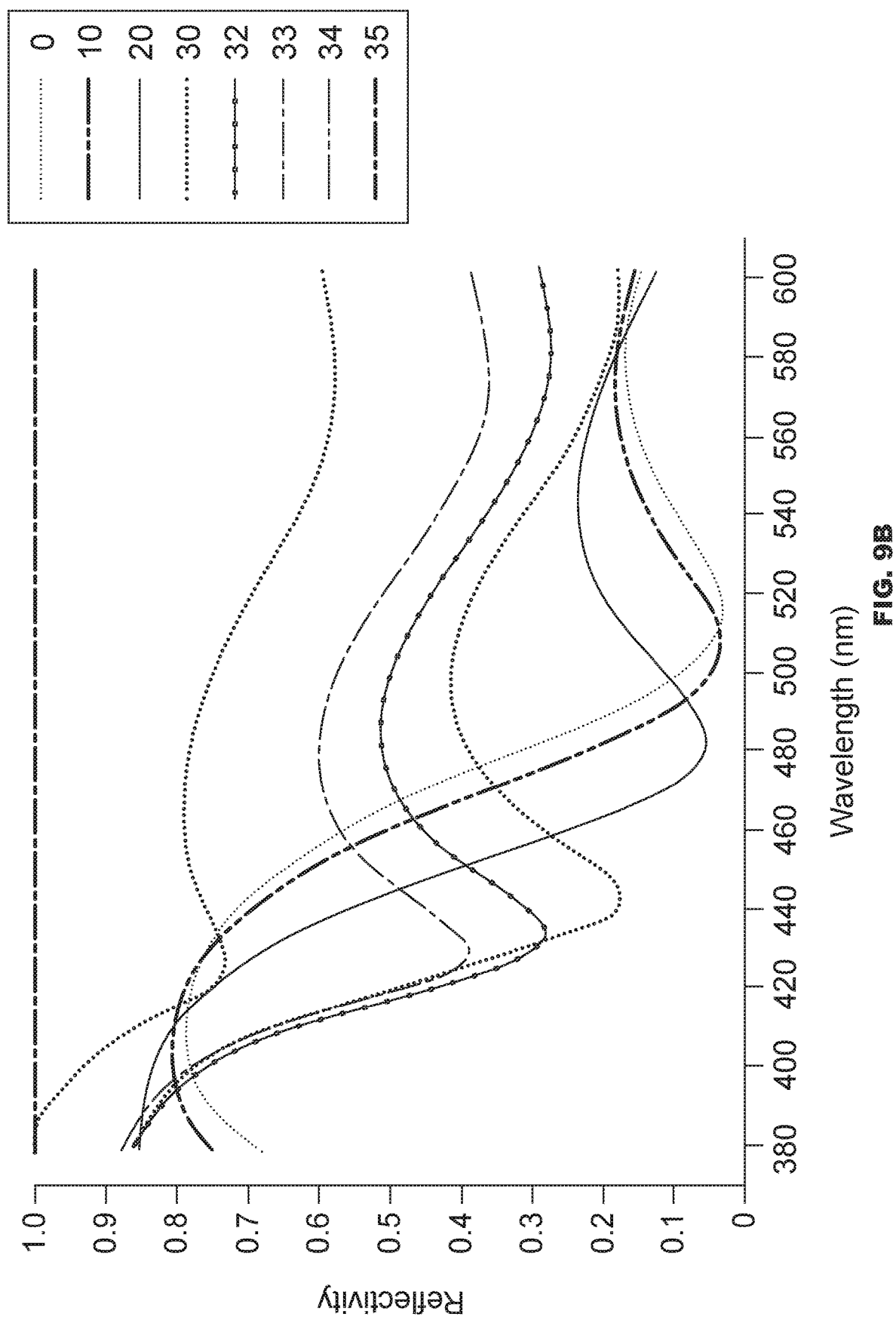

LED UTILIZING INTERNAL COLOR CONVERSION WITH LIGHT EXTRACTION ENHANCEMENTS

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region (e.g., a p-n diode) formed over the n-type layer or layers, and one or more p-type layers doped with, for example, magnesium, formed over the active region. Electrical contacts are formed on the n-type and p-type regions.

One class of blue and green LEDs use GaInN/GaN strained quantum wells or GaInN/GaInN strained quantum wells located between the n-type and p-type layers to generate light by the recombination of holes and electrons injected from these layers. The present disclosure generally relates to improve the efficiency of these quantum well devices.

SUMMARY

A light emitting diode (LED) device may include an n-type layer formed on a transparent substrate. A photoluminescent (PL) in the n-type layer quantum well (QW) and an electroluminescent (EL) QW may be formed on the n-type layer. The PL QW and the EL QW may be separated from one another by a portion of the n-type layer. A p-type layer may be formed on the EL QW. Trenches may be formed extending into the n-type layer, the trenches defining an emitting area. A passivation material may be formed on sidewalls of the trenches and n-type contacts may be formed therein. A p-type contact may be formed on an upper surface of the p-type layer. A dichroic mirror may be formed on at least a lower surface of the transparent substrate.

A LED may include a substrate and a first epitaxial layer formed on the substrate. An epitaxial reflector may be formed on the first epitaxial layer. The epitaxial reflector may include multiple layers of Group III-V semiconductor materials having different compositions. A second epitaxial layer may be formed on the epitaxial reflector. An n-type layer may be formed on the second epitaxial layer. A photoluminescent PL QW may be formed in the n-type layer. An EL QW may be formed on the n-type layer. The EL QW and the PL QW may be separated from one another by a portion of the n-type layer. A p-type layer may be formed on the EL QW. A p-type electrode may be formed on an upper surface of the p-type layer. A dielectric passivation layer may be formed on the upper surface of the p-type layer, sidewalls of the p-type layer, sidewalls of the EL QW, sidewalls of the portion of the n-type layer, sidewalls of PL QW. An n-type electrode may be formed on the dielectric passivation layer and the n-type layer.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIG. 7D is a cross section view illustrating forming a dichroic mirror on a bottom surface of the LED device;

FIGS. 9A-9B are charts illustrating reflectivity of two different dichroic mirror designs over different angles of incidence for different wavelengths of light.

DETAILED DESCRIPTION

Figure 1:
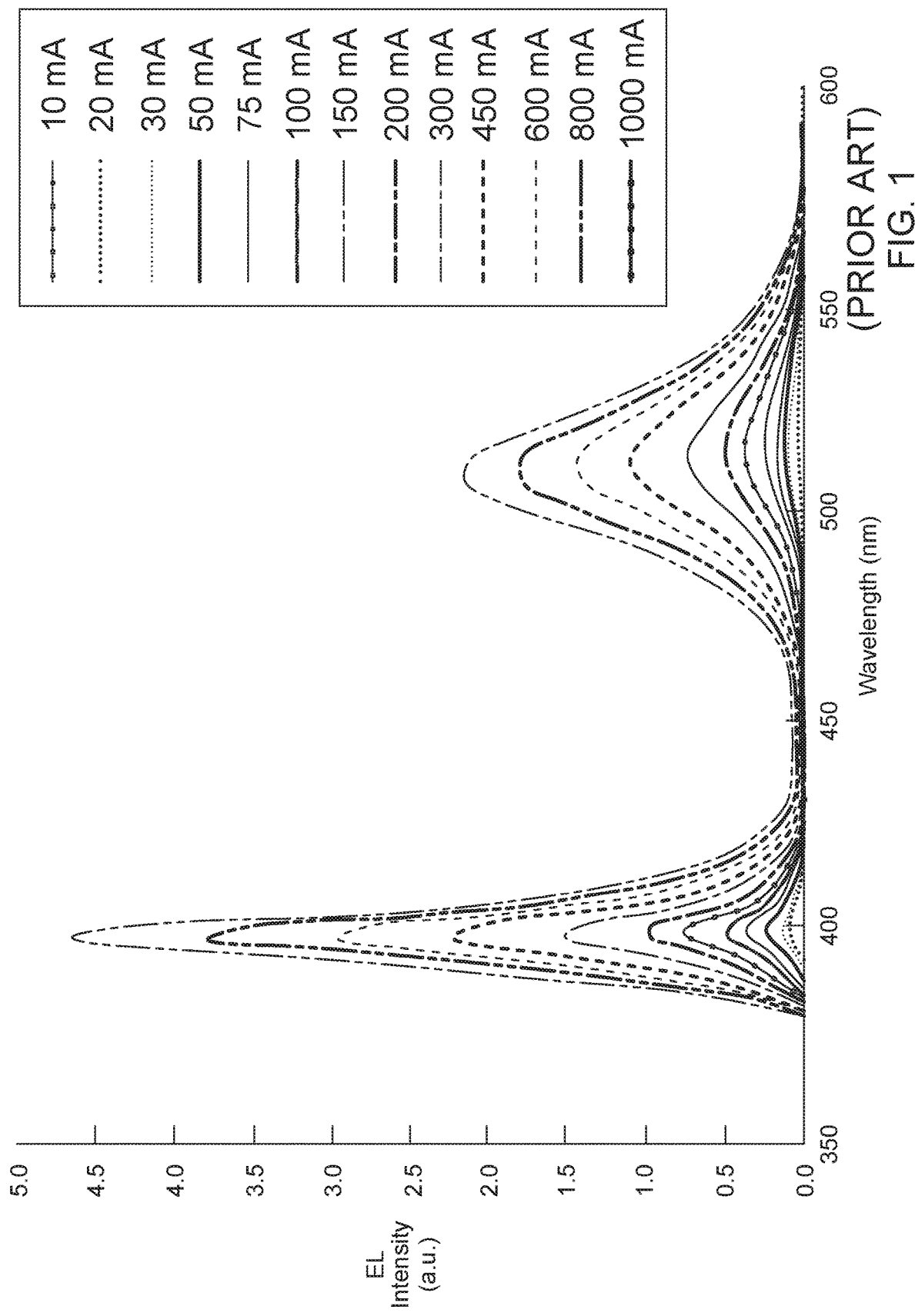
FIG. 1 is a graph illustrating the emission of a light emitting diode (LED) wafer utilizing electroluminescence (EL) and photoluminescence (PL) in which the EL is insufficiently absorbed by PL emitting quantum wells, resulting in an undesirable double-peaked spectrum.

Examples of different light emitting diode ("LED") implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

There is interest in green and yellow LEDs with high radiance and high wall plug efficiency (WPE) for diverse applications such as displays (e.g., micro-displays), architectural lighting, and general illumination systems based on mixing the emission of direct color LEDs rather than phosphor conversion. These applications may be limited by the relatively poor WPE of conventional green and yellow LEDs. The so-called efficiency droop phenomenon may be much more severe in conventional green LEDs as compared to blue LEDs. Green LEDs may be particularly inefficient when they are driven at the high current densities required for projection display applications. The higher operating voltage of green LEDs relative to blue and red LEDs further complicates the design of driver circuitry and heat sinks.

The photoluminescence (PL) of green InGaN multi-quantum wells (MQWs) excited by absorption of shorter wavelength photons may be more efficient than the electroluminescence (EL) excited by electrical injection the same MQWs sandwiched in a p-n junction. This may be explained at least in part by a more even distribution of carriers between the MQWs when carriers are generated by optical absorption instead of electrical injection. The efficiency droop in EL applications may be exacerbated by an uneven distribution of carriers among the MQWs resulting from differences in the electrical transport behavior of holes and electrons. Using the PL from green MQWs excited by absorption of the EL of a shorter wavelength may be a promising method to improve the efficiency of high-radiance green LEDs. This concept may also benefit from the typically lower operating voltage of blue or near-ultraviolet LEDs compared to state-of-the-art electrically-injected green LEDs.

Green emitting MQWs may be produced in a separate epitaxial growth run from blue quantum wells that emit the EL required to photo-pump the green MQWs. However, using separate growth runs may be undesirable with respect to manufacturing throughput in the epitaxy process. In addition, multiple epitaxial growth runs may have the further drawback of requiring additional downstream manufacturing steps to join together the EL and PL components of the device in a way that efficiently couples light from one into the other. This approach may be impractical for applications that require small form factors such as micro-LED displays.

It may be desirable to integrate the EL and PL components of the LED in a single epitaxial growth run. The green MQWs may be located, for example, on an n-type side of a p-n junction, and may be separated from electrically injected shorter-wavelength MQWs by an n-type conducting layer. As such, any p-n junction recombination current may not flow through the green MQWs.

As shown in FIG. 1, a diagram illustrating wavelength peaks of light emitted from MQWs combining violet EL and green PL. Only a fraction of violet EL light (e.g., 400 nm) may be absorbed in the green MQWs. A large fraction of the 400 nm EL may escape from the LED without being converted to green. This may result in a double-peaked emission spectrum that is not perceived by the eye as green.

The low single-pass absorption probability in a quantum well may need to be overcome to use the PL concept in the manufacture of practical LEDs with useful color characteristics. More than 40% of blue light may be transmitted after passing once through a stack of 30 PL QWs. Many passes may be required through a practical number of PL QWs to convert all of the blue light into green light.

The following description includes LED design improvements that may hinder the escape of shorter-wavelength EL photons from a device while promoting the escape of longer-wavelength PL photons. These improvements may increase the probability that the shorter-wavelength EL will be internally absorbed within the LED and converted to the desired longer wavelength while minimizing penalties in the extraction efficiency of the longer wavelength. The improvements described below may be used to produce an LED of a single color (e.g., green or yellow) in which the extraction of the EL wavelength may be completely suppressed. The improvements may also be used to produce a phosphor-free white LED (e.g., using green and red PL emitting quantum wells) in which the extraction of the blue EL wavelength may be only partly suppressed.

Figure 3:
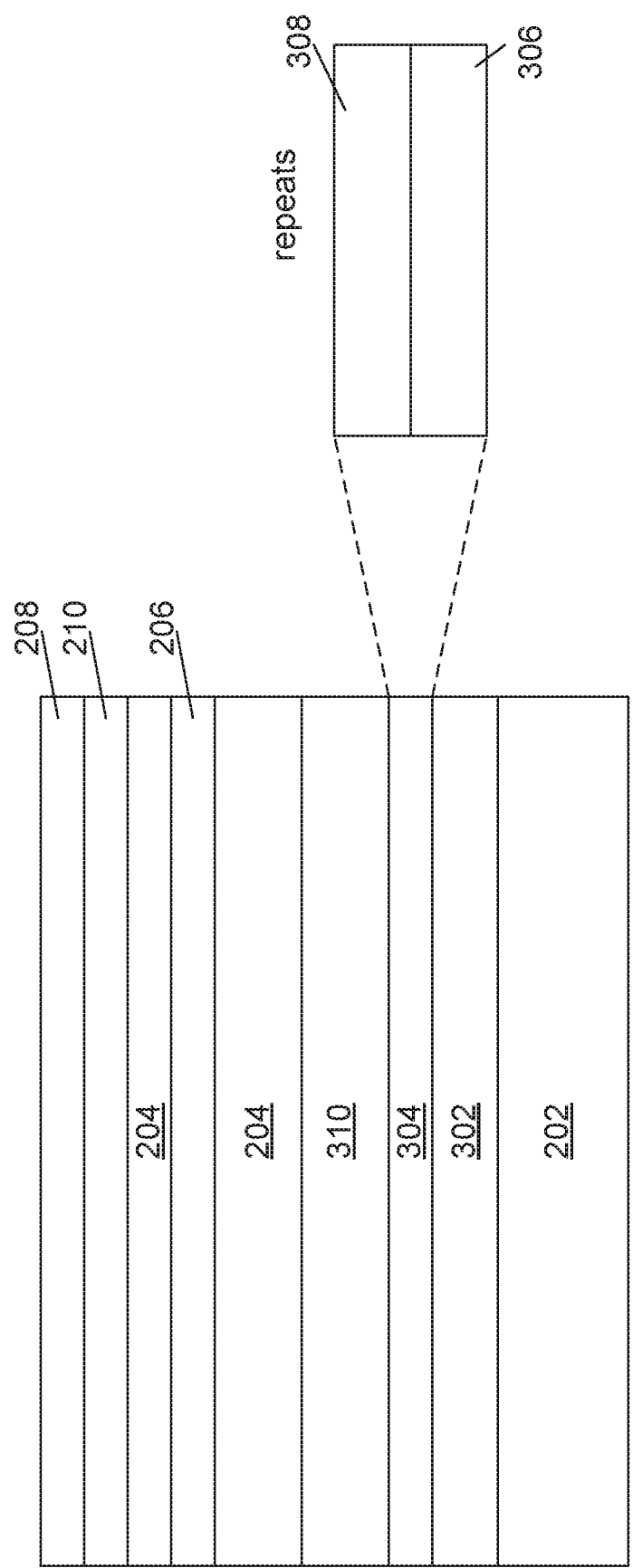
FIG. 3 is a cross-section view illustrating a green LED with an epitaxial reflector.

As described in additional detail below, an epitaxial wafer may contain a p-type layer, an n-type layer, and a first set of one or more QWs with shorter emission wavelength disposed between the n-type and p-type layers. One or more additional sets of one or more QWs with longer emission wavelengths may be disposed on either side of, but not within, the depletion region between the n-type and p-type layers. The one or more additional sets of QWs may be disposed on the n-type side as shown in FIGS. 3 and 4. The elements described above may be grown on the same substrate wafer in the same epitaxial growth run.

The longer wavelength QWs may have a peak wavelength at least 20 nm longer and as much as 1200 nm longer than the shorter wavelength QWs.

An electrode may cover either the p-type or n-type layer. The electrode may have high reflectivity for the EL emission wavelength, but not necessarily for other wavelengths. The reflecting electrode may be located on the p-type layer.

One or more of the following elements may be included to increase the probability that shorter wavelength photons generated by EL may be absorbed in the longer wavelength QWs.

A dichroic mirror may be coated on one or more external surfaces of the LED chip. The dichroic mirror may have a high reflectivity at the shorter wavelength of EL emissions and a low reflectivity at the longer wavelength of PL emissions over a wide range of angles of incidence.

A photonic crystal may be patterned into one or more external or internal surfaces of the LED. The periodicity of the photonic crystal may be selected to minimize diffraction of the shorter wavelength EL emissions and maximize diffraction of the longer wavelength PL emissions.

An epitaxial mirror may be grown within the epitaxial layer structure of the LED wafer. This epitaxial mirror may have a higher angle-averaged reflectivity for the shorter wavelength EL emissions as compared to the longer-wavelength PL emissions.

A distributed Bragg reflector (DBR) may be integrated into the wafer. The DBR may be formed by the growth of a sequence of epitaxial layers with differences in doping and/or alloy composition combined with a post-growth electrochemical reaction. The post-growth reaction may be selective with respect to doping and/or alloy composition and may reduce the effective refractive index of some of the layers in the epitaxial sequence. The thickness of the epitaxial layers may be chosen to result in a DBR periodicity that maximizes reflectivity corresponding to the shorter wavelength of EL emissions.

The distance between the reflecting electrode described above and the EL emitting QWs may be selected to control the internal radiation angular distribution of the EL emissions in a way that maximizes its absorption in the PL emitting QWs.

Figure 2A:
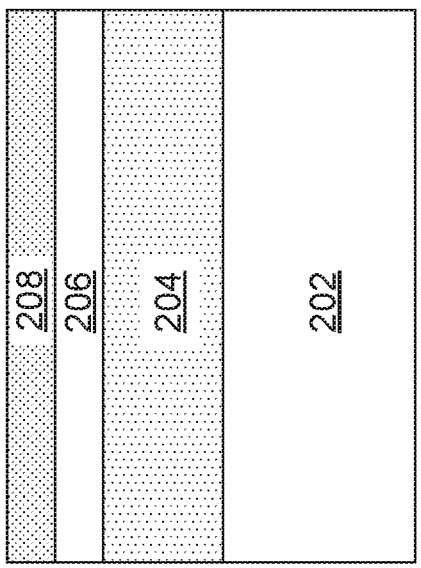
FIG. 2A is a conventional green LED.
Figure 2B:
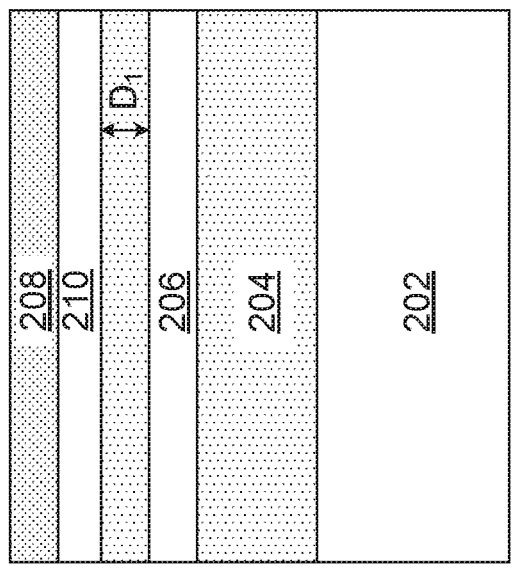
FIG. 2B is a green LED utilizing PL obtained by conversion of violet EL.
Figure 2C:
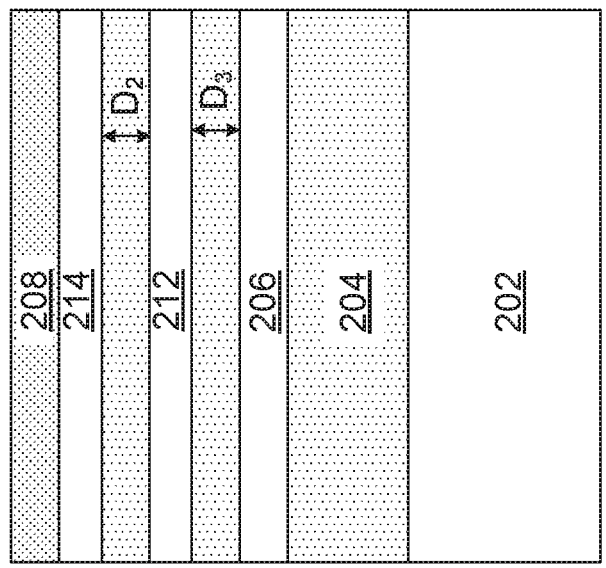
FIG. 2C is a white LED wafer utilizing blue EL and partial conversion of blue EL into green PL and red PL.

Referring now to FIGS. 2A-2C, cross-section views of epitaxial wafers are shown. FIG. 2A illustrates a conventional green LED. FIG. 2B illustrates a green LED utilizing PL obtained by conversion of violet EL. FIG. 2C illustrates a white LED wafer utilizing blue EL and partial conversion of the blue EL into green PL and red PL.

FIGS. 2A-2C may have common features, such as a substrate 202, an underlying n-type layer 204, a PL QW 206, and a p-type layer 208. The substrate 202 may comprise a crystalline material and may be a commercial substrate. The substrate 202 may comprise sapphire, SiC, or GaN.

The n-type layer 204 may comprise any Group III-V semiconductors, including binary, ternary, and quaternary alloys of gallium, aluminum, indium, and nitrogen, also referred to as III-nitride materials. In an example, the n-type layer 204 may comprise GaN. The n-type layer 204 may be doped with n-type dopants, such as Si or Ge. The n-type layer 204 may have a dopant concentration significant enough to carry an electric current laterally through the n-type layer 204. In an example, the n-type layer 204 may be highly doped.

The n-type layer 204 may be formed using conventional deposition techniques, such as metal-organic chemical vapor deposition (MOCVD), molecular beam epitaxy (MBE), or other epitaxial techniques. In an epitaxial deposition process, chemical reactants provided by one or more source gases are controlled and the system parameters are set so that depositing atoms arrive at a deposition surface with sufficient energy to move around on the surface and orient themselves to the crystal arrangement of the atoms of the deposition surface. Accordingly, the n-type layer 204 may be grown on the sapphire substrate 202 using conventional epitaxial techniques. A nucleation layer (not shown) may be formed on the substrate 202 prior to the n-type layer 204. The nucleation layer may comprise GaN or AlN.

The p-type layer 208 may be formed using the conventional epitaxial deposition techniques described above. The p-type layer 208 may comprise any Group III-V semiconductors, including binary, ternary, and quaternary alloys of gallium, aluminum, indium, and nitrogen, also referred to as III-nitride materials. In an example, the p-type layer 208 may comprise GaN. The p-type layer 208 may be doped with p-type dopants, such as Mg. An electron blocking layer (not shown) may be formed below the p-type layer 208.

The PL QW 206 may be formed using the conventional epitaxial deposition techniques described above. The PL QW 206 may comprise a sequence of multiple QWs emitting the same wavelength of light. The PL QW 206 may comprise different layers of InGaN and GaN. In an example, the PL QW 206 may emit a green light having a wavelength of approximately 530 nm. The emission color may be controlled by the relative mole fractions of In and Ga in the InGaN layer and/or thicknesses of the multiple QWs and barrier thickness. A higher mole fraction of In may result in a longer wavelength.

An individual QW within the PL QW 206 may have an InGaN thickness ranging from approximately 0.5 nm to 15 nm and a GaN thickness ranging from approximately 2 nm to 100 nm. The total number of quantum wells in the PL QW 206 may be between 1 and 50. The PL QW 206 may be located in the n-type layer 204, near to, but not within, the depletion region of the p-n junction at operating forward bias.

As shown in FIG. 2B, the green LED utilizing a PL QW 206 may also include an EL QW 210 within a depletion region of the p-n junction. The EL QW 210 may be formed using the conventional epitaxial deposition techniques described above. The EL QW 210 may comprise a sequence of multiple QWs emitting the same wavelength of light. The EL QW 210 may comprise different layers of InGaN and GaN. In an example, the EL QW 210 may emit a violet light having a wavelength of approximately 400 nm.

The EL QW 210 may be separated from the PL QW 206 by a first distance D1 of the n-type layer 204. The first distance D1 may range from approximately 5 nm to approximately 1000 nm. It should be noted, the first distance $D_1$ may comprise an additional layer of n-type material grown at temperature low enough to not degrade the optical properties of the layers beneath it.

As shown in FIG. 2C, a white LED may utilize one or more EL QWs and multiple groups of PL QWs. The white LED may include the PL QW 206, a second PL QW 212, and an EL QW 214. The second PL QW 212 may comprise different layers of InGaN and GaN. The second PL QW 212 may comprise a sequence of multiple QWs emitting the same wavelength of light. The EL QW 214 may comprise different layers of InGaN and GaN. The EL QW 214 may comprise a sequence of multiple QWs emitting the same wavelength of light.

The PL QW 206 and the second PL QW 212 may be located within the n-type layer 204 near to, but not within, the depletion region of the p-n junction at operating forward bias. The EL QW 214 may be located within a depletion region of the p-n junction.

The second PL QW 212 and the EL QW 214 may be formed using the conventional epitaxial deposition techniques described above. The second PL QW 212 and the EL QW 214 may comprise InGaN/GaN. In an example, the second PL QW 212 may emit a red light having a wavelength of approximately 610 nm. In an example, the EL QW 214 may emit a blue light having a wavelength of approximately 440 nm. The EL QW 214 may be separated from the second PL QW 210 by a second distance $D_2$ of the n-type layer 204. The second PL QW 212 may be separated from the PL QW 206 by a third distance $D_3$ of the n-type layer 204. The second distance $D_2$ may range from approximately 5 nm to approximately 1000 nm. The third distance $D_3$ may range from approximately 5 nm to approximately 1000 nm. It should be noted that the second distance $D_2$ and the third distance $D_3$ may comprise additional layers of n-type material grown at temperature low enough to not degrade the optical properties of the layers beneath it.

The optimum layer thickness, doping, and growth conditions for the PL QWs may not be the same as those parameters in an electrically injected LED of the same color. The PL QWs and/or barriers thereof may be doped with donors such as Si or Ge in order to prevent any significant voltage drop across the PL QW region when the p-n junction surrounding the EL active region is in forward bias.

The rest of the growth process may proceed as for a conventional LED wafer. The p-type layer 208 may have a thickness different from the optimum p-type layer thickness in a conventional LED wafer. In an LED with a reflecting p-electrode, the thickness of the p-type layer 208 may be adjusted to optimize the optical polarization state and internal radiation pattern of the EL emission for a particular purpose. The thickness that maximizes internal conversion of EL to PL as described herein may be different from the thickness that maximizes the light output from a conventional LED.

Referring now to FIG. 3, a cross-section view illustrating a green LED with an epitaxial reflector 304 is shown. Additional epitaxial layers may be grown for the purpose of selectively reflecting shorter wavelength light in a direction away from the substrate 202.

A first epitaxial layer 302 may be formed on the substrate 202 using one or more of the epitaxial growth techniques described above. A nucleation layer (not shown) may be formed on the substrate 202 prior to the formation of the first epitaxial layer 302. The nucleation layer may comprise GaN or AlN. The first epitaxial layer 302 may comprise any Group III-V semiconductors, including binary, ternary, and quaternary alloys of gallium, aluminum, indium, and nitrogen, also referred to as III-nitride materials. In an example, the first epitaxial layer 302 may comprise GaN. The first epitaxial layer 302 may be doped with n-type dopants, such as Si or Ge.

The epitaxial reflector 304 may be formed on the first epitaxial layer 302. The epitaxial reflector 304 may be formed using the conventional epitaxial techniques described above.

The epitaxial reflector 304 may comprise multiple layers of Group III-V semiconductor materials having different compositions. The epitaxial reflector 304 may comprise repetitions of a first layer 306 and a second layer 308. In an example, the first layer 306 may comprise AlInN and the second layer 308 may comprise GaN. The first layer 306 may have a concentration of $Al_{0.82}In_{0.18}N$. The first layer 306 may have a thickness of approximately 42 nm and the second layer 308 may have a thickness of approximately 55 nm. The first layer 306 and the second layer 308 may have different refractive indices and thicknesses optimized to maximize reflectivity at the wavelength and main emission angle of the EL emission. The epitaxial reflector 304 may comprise approximately 35 repetitions of the first layer 306 and the second layer 308. The refractive index of the first layer 306 and the second 308 layer may differ in their as-grown state due to differences in their in alloy composition or doping concentration. The additional epitaxial layers may not form a good reflector in the as-grown state, but may be grown with differences in doping and/or alloy composition that affect their chemical reactivity in post-growth processing. Post growth-processing may transform the layers into an effective reflector, as described below.

In another example, the first layer 306 may comprise AlGaIn and the second layer 308 may comprise AlGaN. In this example, the first layer 306 may have a concentration of $Al_{0.80}Ga_{0.03}In_{0.17}$ and the second layer 308 may have a composition of $Al_{0.02}Ga_{0.98}N$.

The epitaxial reflector 304 may be made from any two layers of $Al_xIn_yGa_zN$, where at least one of x, y, or z takes a different value in each layer. Optimal values of x, y, and z may require fewer layer repetitions and may have a better reflectivity characteristic vs. incident angle. Less desirable values of x, y, and z may still provide sufficient reflectivity, but larger numbers of layer repetitions may be required and angular characteristics may not be as preferable. Useful ranges of values for x, y, and z may be determined by requirements of crystal strain (e.g., a lattice parameter may not differ too much from GaN's lattice parameter) and transparency (e.g., the band gap energy of the material may be larger than the photon energy of the EL emission).

The epitaxial reflector 304 may also comprise two layers of GaN with large differences in dopant concentration. For example, the first layer 306 may be doped with Ge at a concentration of $10^{18}$ atoms/cm$^3$ and the second layer 308 may be doped with Ge at a concentration of $10^{20}$ atoms/cm$^3$. This combination may be used with or without a porosifying reaction described below with reference to FIG. 6C. If the porosifying reaction is not used, a large number of repetitions of the layers may be needed (e.g., 100 repetitions).

The epitaxial reflector 304 may comprise alternating layers of an AlInN layer.

A second epitaxial layer 310 may be formed on the epitaxial reflector 304. The second epitaxial layer 310 may be formed using one or more of the epitaxial growth techniques described above. The second epitaxial layer 310 may comprise any Group III-V semiconductors, including binary, ternary, and quaternary alloys of gallium, aluminum, indium, and nitrogen, also referred to as III-nitride materials. In an example, the second epitaxial layer 310 may comprise GaN. The second epitaxial layer 310 may be doped with n-type dopants, such as Si or Ge. The second epitaxial layer 310 may have the same dopant concentration as the first epitaxial layer 302, or the dopant concentrations may different.

The n-type layer 204, the PL QW 206, the EL QW 210, and the p-type layer 208 may be formed as described above with reference to FIGS. 2A-2C.

Figure 4A:
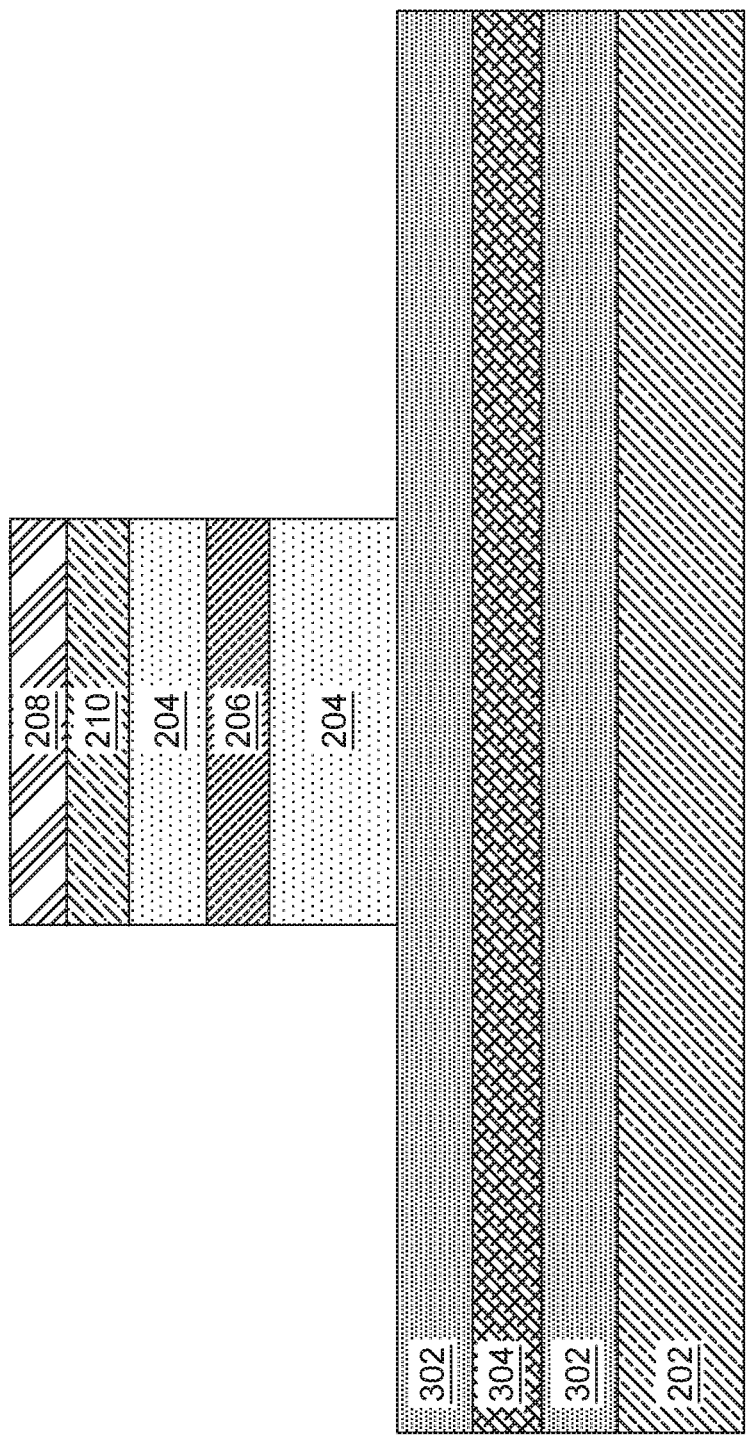
FIG. 4A is a cross-section view illustrating patterning and etching the epitaxial layers shown in FIG. 3 to expose an upper surface of an n-type epitaxial layer.

Referring now to FIGS. 4A-4F, cross-section views illustrating forming a micro-LED 400 incorporating the epitaxial reflector 304 are shown. As shown in FIG. 4A, the epitaxial layers shown in FIG. 3 may be patterned and etched using conventional techniques to expose an upper surface of the n-type layer 204.

Figure 4B:
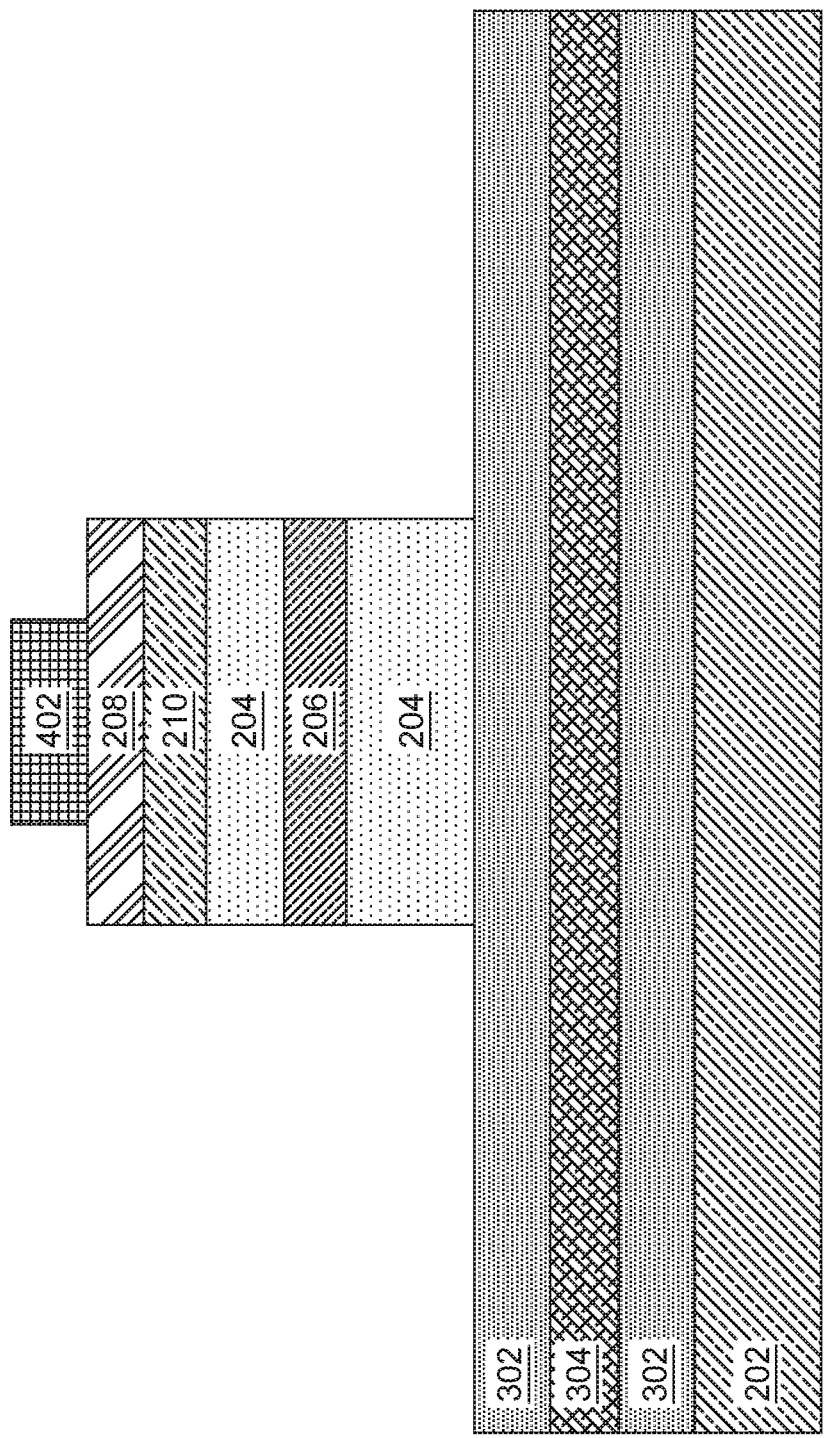
FIG. 4B illustrates forming a reflecting p-electrode on an upper surface of a p-type layer.

In FIG. 4B, a reflecting p-electrode 402 may be formed on an upper surface of the p-type layer 208. The reflecting p-electrode 402 may comprise any conductive material that reflects visible and/or ultraviolet light, such as, for example, a refractive metal. The reflecting p-electrode 402 may comprise one or more of a metal such as silver, a metal stack, a sequence of transparent conducting oxide layers with different refractive indices, a series of dielectric layers with different refractive indices on top of a transparent conductive oxide layer, or combinations thereof. The reflecting p-electrode 402 may be formed using a conventional deposition technique, such as, for example, chemical vapor deposition (CVD), plasma-enhanced CVD (PECVD), atomic layer deposition (ALD), evaporation, sputtering, chemical solution deposition, spin-on deposition, or other like processes.

Figure 4C:
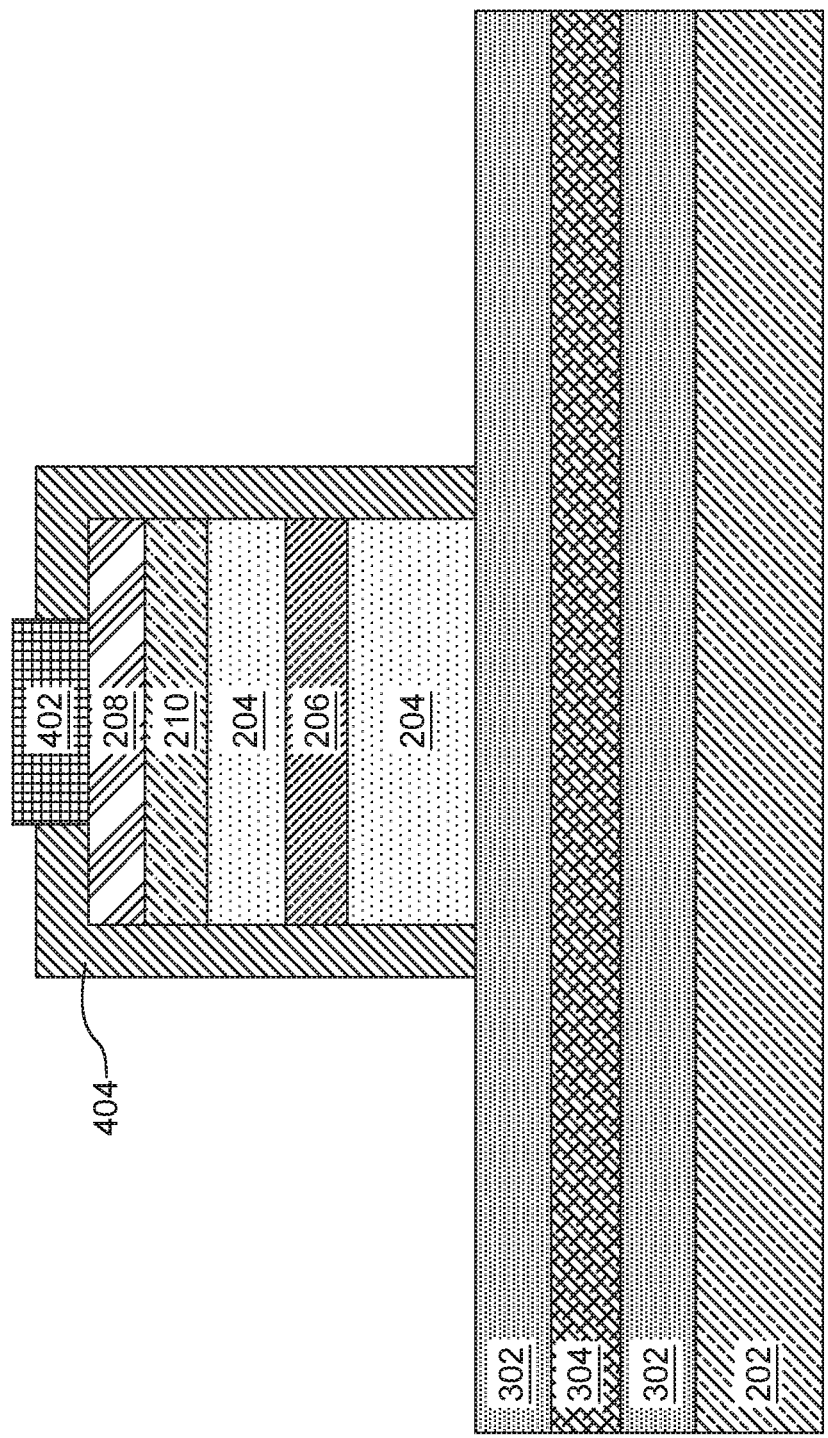
FIG. 4C illustrates forming a conformal dielectric passivation layer on an upper surface and sides of the p-type layer, sides of an EL QW, sides of an n-type layer, sides of a PL QW, and an upper surface of the undoped epitaxial layer.

In FIG. 4C, a conformal dielectric passivation layer 404 may be formed on the upper surface and sides of the p-type layer 208, sides of the EL QW 210, sides of the portion of the n-type layer 204, sides of the PL QW 206, and an upper surface of the n-type layer 204. The dielectric passivation layer 404 may comprise materials such as, but not limited to, $SiO_2$ or $SiN_x$.

Figure 4D:
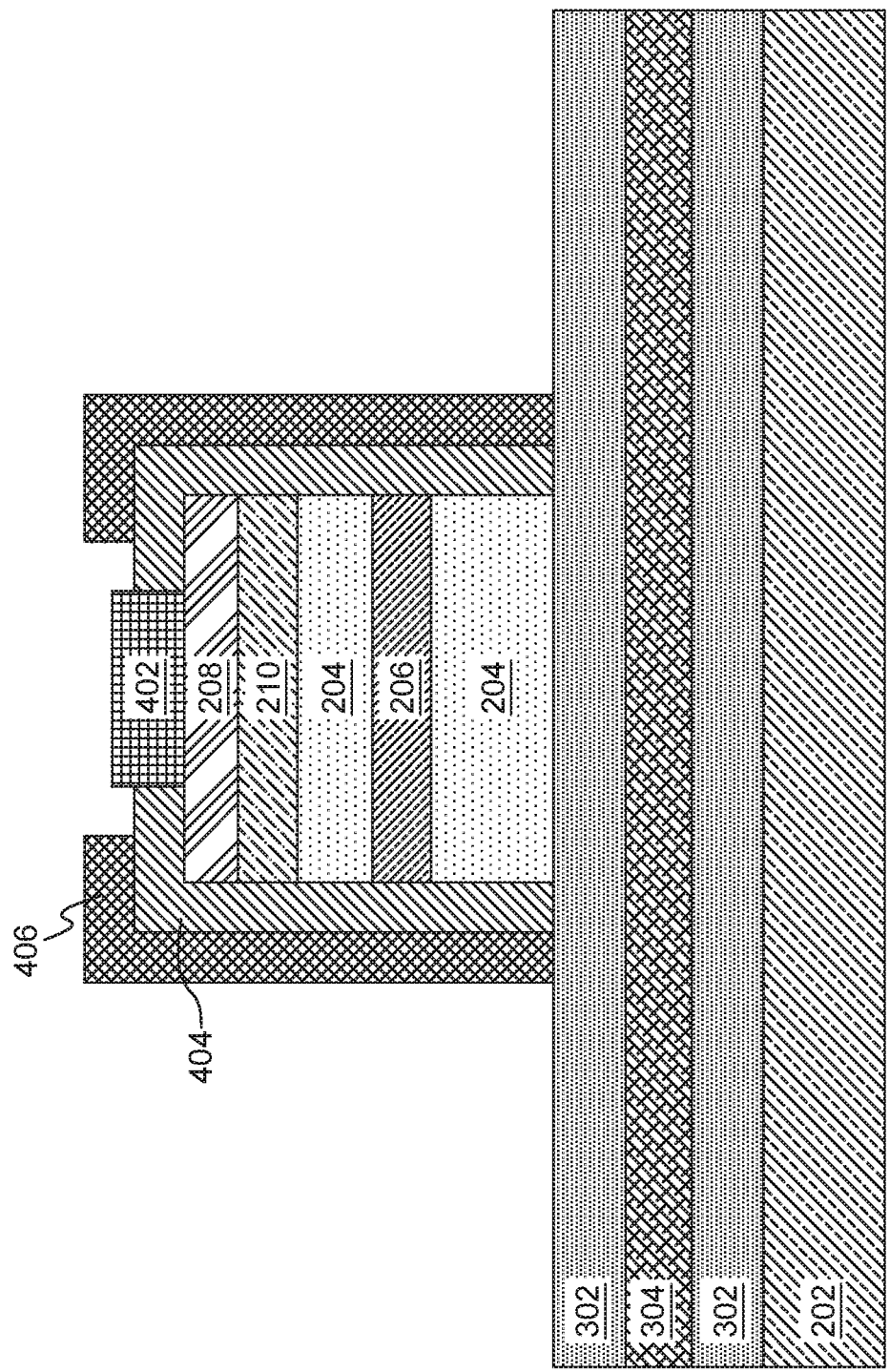
FIG. 4D illustrates forming a reflecting n-type electrode on the dielectric passivation layer.

In FIG. 4D, a reflecting n-type electrode 406 may be conformally deposited on the dielectric passivation layer 404. The reflecting n-type electrode 406 may comprise any conductive material that reflects visible and/or ultraviolet light, such as, for example, a refractive metal. The reflecting n-type electrode 406 may comprise one or more of a metal such as silver, a metal stack, a sequence of transparent conducting oxide layers with different refractive indices, a series of dielectric layers with different refractive indices on top of a transparent conductive oxide layer, or combinations thereof. The reflecting n-type electrode 406 may be formed using a conventional deposition technique, such as, for example, CVD, PECVD, ALD, evaporation, sputtering, chemical solution deposition, spin-on deposition, or other like processes.

The epitaxial reflector 304 may be electrically conducting and may be placed within a distance of less than 1 micron from the reflecting p-type electrode 402 such that the epitaxial reflector 304 and reflecting p-type electrode 402 form an optical micro-cavity which contains both the PL and EL emitting QWs. The position of the EL emitting QWs within the micro-cavity may be selected to optimize the angular distribution of emitted EL radiation. The radiation distribution may be controlled such that all or at least most of the EL is emitted into angles for which the epitaxial reflector has a high reflectivity. The epitaxial reflector 304 may comprise a sequence of doped AlInN/GaN layers or a sequence of porous GaN/non-porous GaN layers.

Figure 4E:
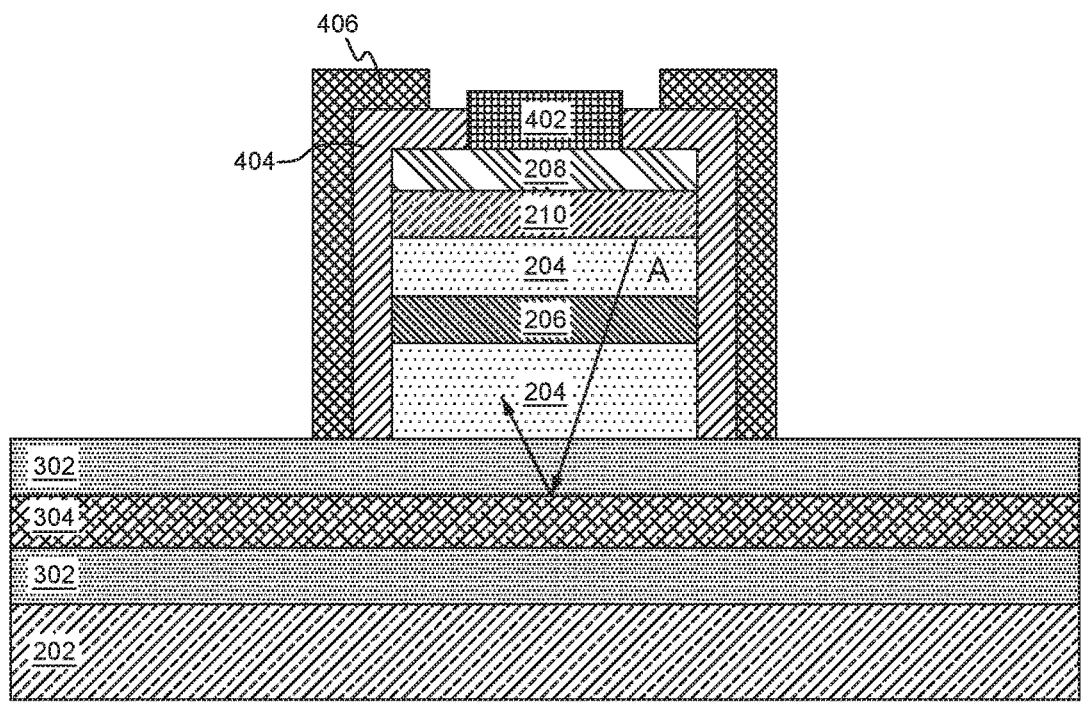
FIGS. 4E-4F illustrate the reflectivity of the epitaxial reflector based on wavelength and incident angle.
Figure 4F:
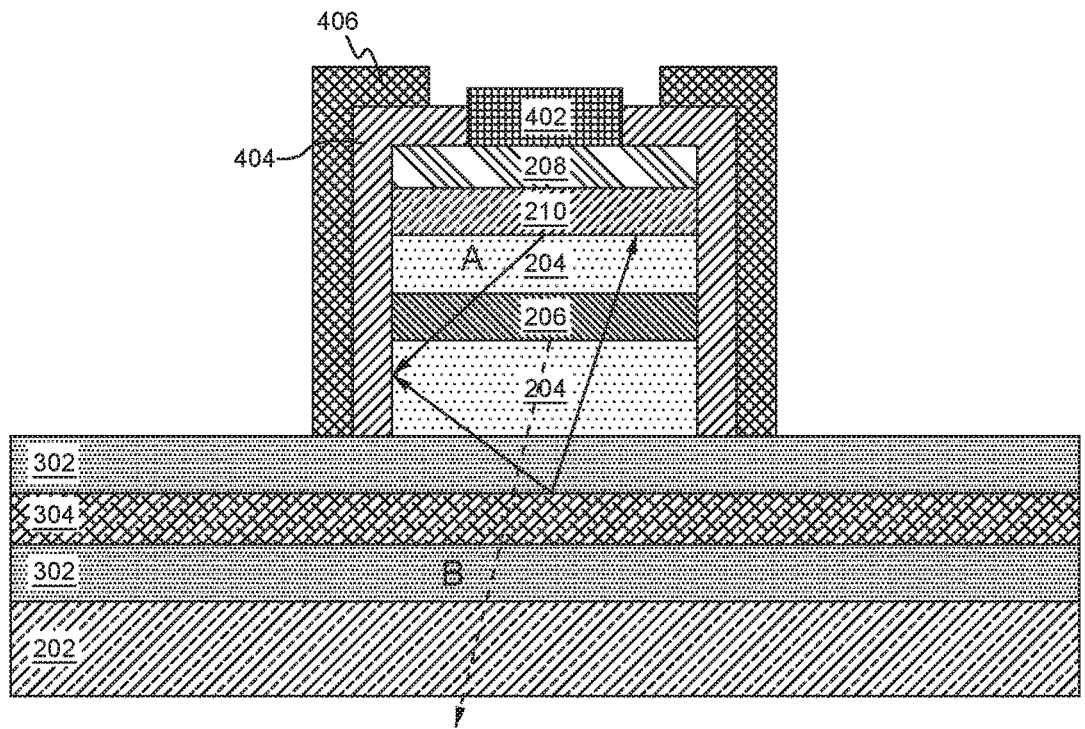

FIGS. 4E-4F illustrate the reflectivity of the epitaxial reflector 304 based on wavelength and incident angle are shown. To improve wavelength selectivity the epitaxial reflector 304 may take advantage of the higher refractive index contrast between GaN and AlN at shorter vs. longer wavelengths. The epitaxial reflector 304 may also exploit differences in the internal angular radiation profiles of PL QWs and EL QWs. The EL QWs may be tailored to a desired radiation profile by changing the thickness of the p-type layer 208. The radiation profile of the PL QWs farther away from the reflecting p-type electrode 402 may be less sensitive to the thickness of the p-type layer 308.

As shown in FIG. 4E, light A emitted from the EL QW 210 may pass through the n-type layer 204, the PL QW 206, and the second epitaxial layer 310 and may be reflected back by the epitaxial reflector 304.

As shown in FIG. 4F, light A emitted from the EL QW 210 may pass through the n-type layer 204, the PL QW 206, and the second epitaxial layer 310 and may be reflected back by the epitaxial reflector 304. Light B emitted from the PL QW 206 may pass through the n-type layer 204, the second epitaxial layer 310, the epitaxial reflector 304, the first epitaxial layer 302, and the substrate 202 to exit the device.

Designs using the as-grown epitaxial reflector 304 may be most effective in LEDs with small aspect ratios and reflecting sidewalls (e.g., the reflecting n-type electrode 406. Even when the micro-cavity is not formed, the EL emission may be incident on the epitaxial reflector 304 over a relatively narrow range of angles and its reflectivity at large angles of incidence may not be important. It should be noted the bottom surface of the substrate 202 may be roughened or patterned to improve extraction of green PL emission that passes through the epitaxial reflector 304.

Figure 5:
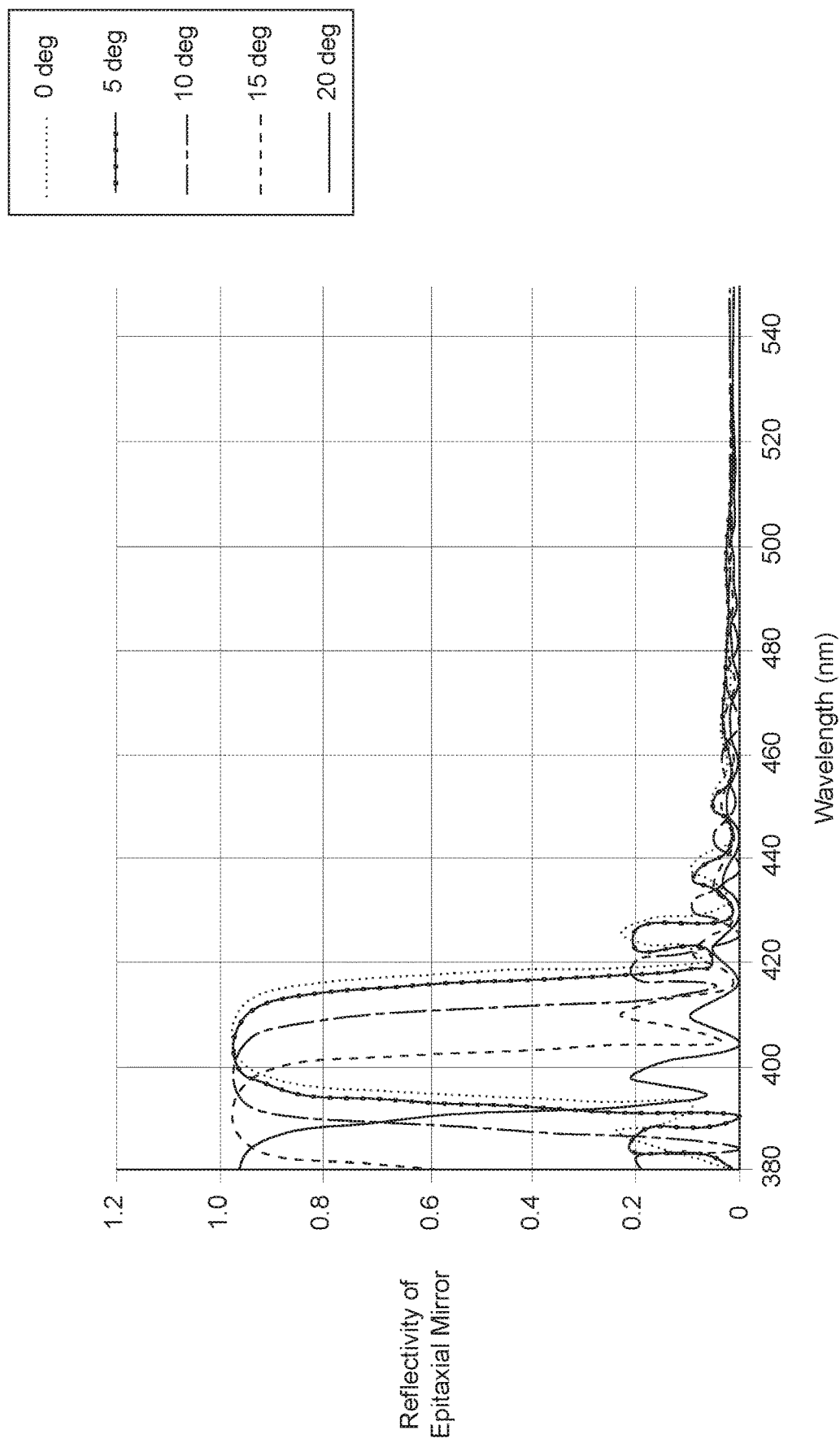
FIG. 5 is a chart illustrating reflectivity of the epitaxial reflector over different angles of incidence for different wavelengths of light.

Referring now to FIG. 5, a chart illustrating reflectivity of the epitaxial reflector 304 over different angles of incidence for different wavelengths of light is shown.

The wafer fabrication processing may be similar as that of a conventional single-wavelength LED and may include conventional steps such as chemical cleaning, acceptor activation anneal, dry etching of mesas, and deposition of metal contacts, passivation and isolation layers. A deeper mesa etch may be required due to the increased thickness of epitaxial material between the p-type layer 208 and the highly doped n-type layer 204 due to the addition of PL emitting QWs that are not part of a standard LED structure.

The deposition of the reflecting p-type electrode 402 on the p-type layer 208 may be similar as in a conventional LED process flow. For example, as described above, an opaque metal that has a high reflectivity across the visible and near-ultraviolet spectrum (e.g., Ag) may be evaporated or sputtered onto the surface of p-type layer 208.

The process flow described above may also be applied in a transparent LED process that uses a conducting oxide layer such as ITO as the p-type electrode 402. A dichroic mirror may be coated on top of the conducting oxide layer to make the electrode reflective at the EL emission wavelength. The dichroic mirror may be applied in a transparent LED chip if the EL wavelength is around 400 nm or shorter. Small openings may be made in the dichroic mirror around the edge of the chip to allow metal contact to the ITO layer, which serves as the p-type electrode 402.

In addition, also applicable to transparent LEDs, the p-type electrode 402 may be comprised of a multiple ITO layers with different porosity that result in differences in refractive index. This sequence may be obtained, for example, using sputter deposition with two different ITO targets. One of the ITO targets may be oriented at an oblique angle relative to the substrate 202. The thickness of a more porous ITO layer (i.e., lower refractive index) and a less porous ITO layer (i.e., higher refractive index) may make an electrically conducting dichroic mirror with high reflectivity at the EL wavelength.

Figure 6A:
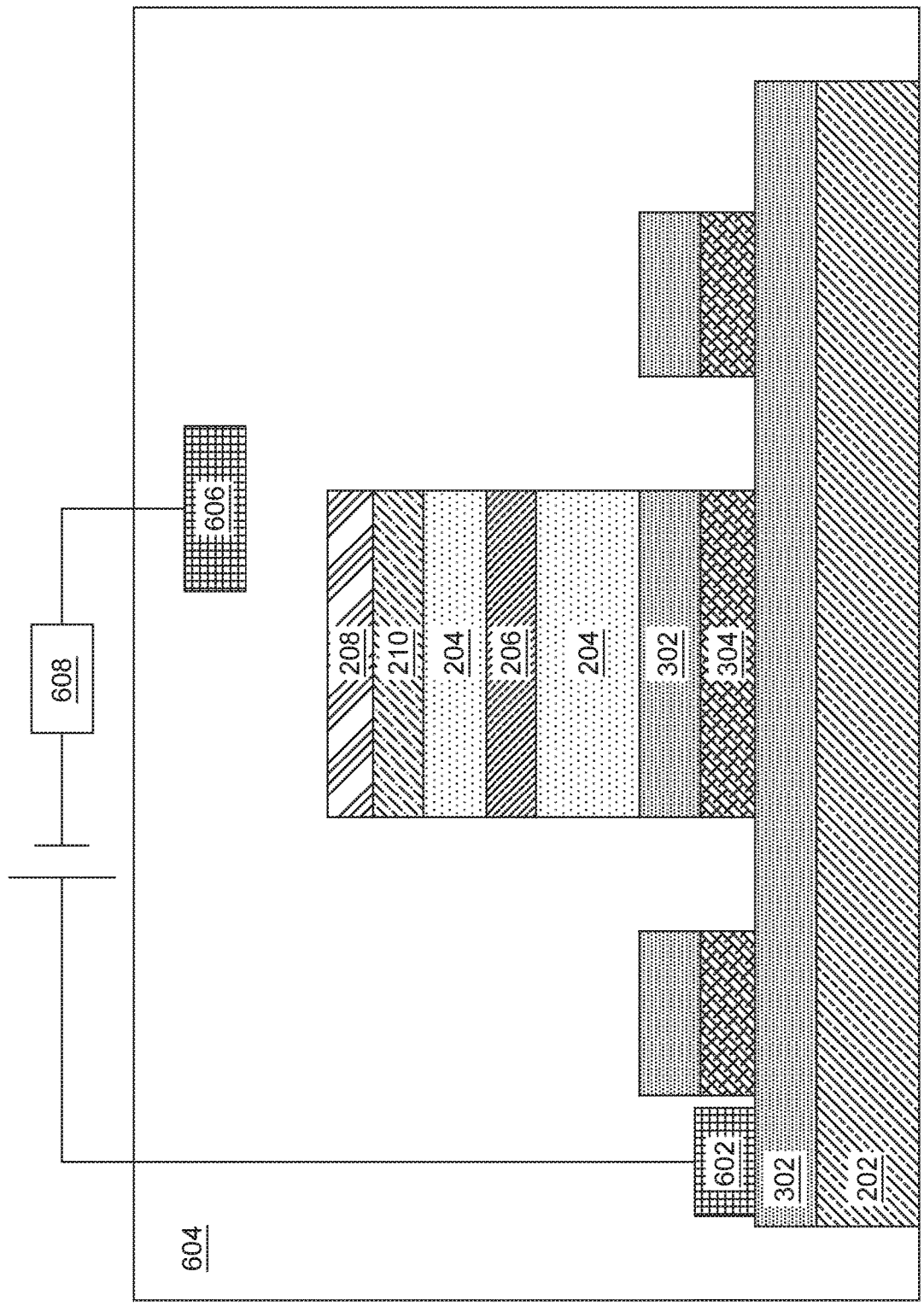
FIG. 6A is a cross-section view illustrating the use of an electrochemical reaction used to improve the reflectivity of the epitaxial reflector.
Figure 6B:
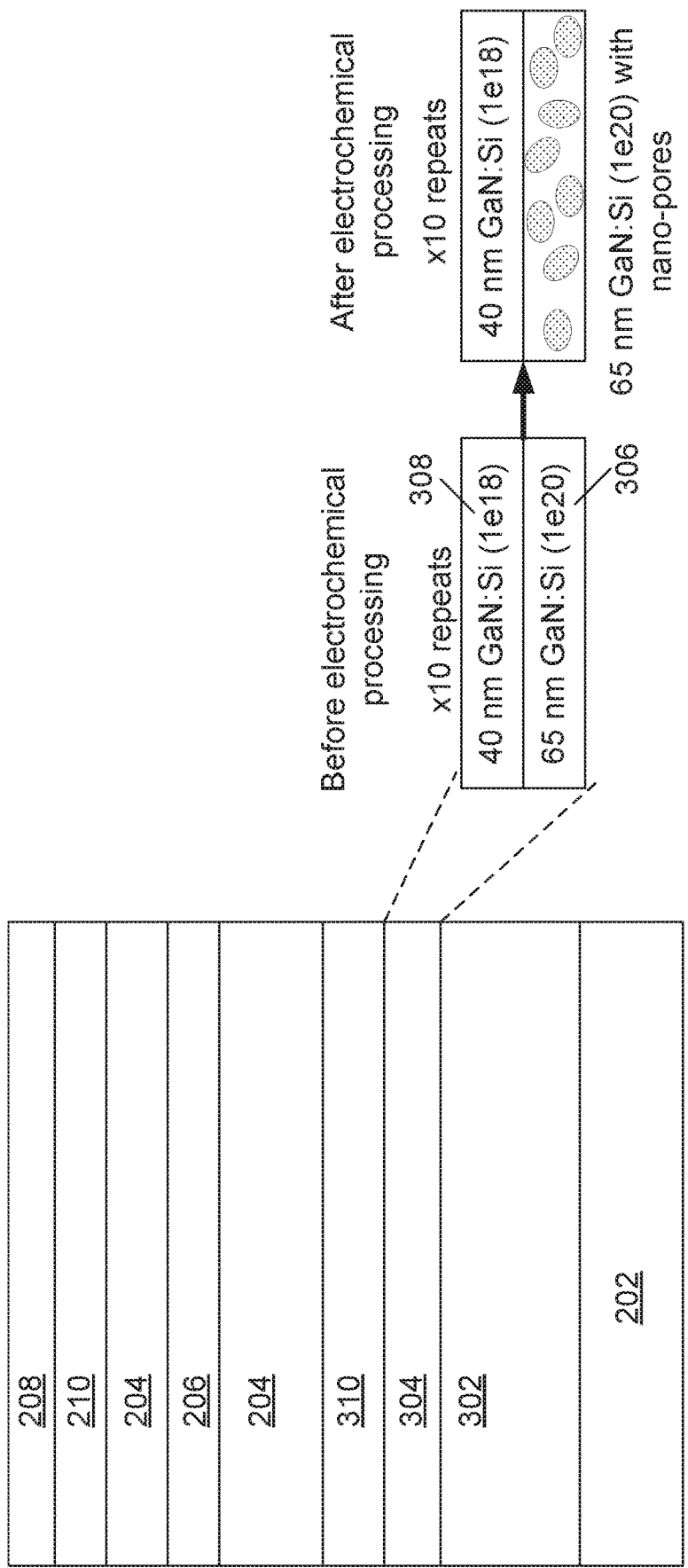
FIG. 6B is a cross-section view illustrating a reaction that may selectively oxidize nitride layers of higher Al mole fraction and may convert them into oxide or oxy-nitride layers of lower refractive index than as-grown material.
Figure 6C:
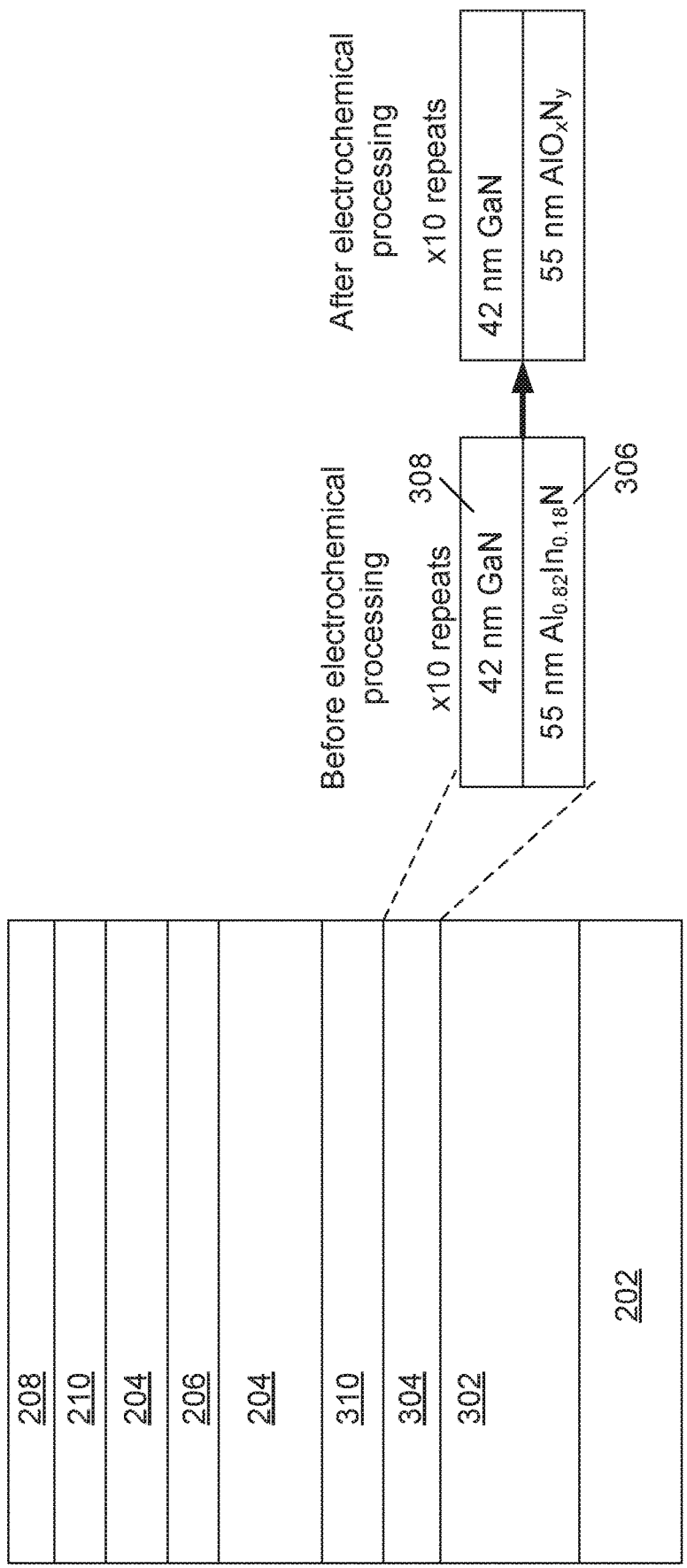
FIG. 6C is a cross-section view illustrating a reaction that introduces microscopic voids (i.e., porosity) into layers that are highly doped with Si or Ge.

Referring now to FIGS. 6A-6C, cross-section views illustrating the use of an electrochemical reaction used to improve the reflectivity of the epitaxial reflector 304 are shown. The electrochemical reaction may be used in a subsequent post-growth processing step to selectively transform some of the epitaxial layers into a material with a different effective refractive index. This may produce a Bragg mirror with maximum reflectivity at the wavelength and main emission angle of the EL emission.

As shown in FIG. 6A, an etching process may be performed on the structure illustrated in FIG. 4A to remove a portion of the n-type layer 204, a portion of the second epitaxial layer 310, and a portion of the epitaxial reflector 304. In an example, a conventional dry etching process may be used. The etching process may expose sidewalls of the epitaxial reflector 304, which may allow the composition of the epitaxial reflector 304 to be modified by the electrochemical reaction. The sidewalls of the epitaxial reflector 304 may be perpendicular to the wafer growth surface.

As described above, the first epitaxial layer 302 and the second epitaxial layer 310 may both be doped with an n-type material, but may have different dopant concentrations. In an example, the first epitaxial layer 302 may have a dopant concentration at its upper surface that is less than the dopant concentration of the second epitaxial layer 310. The lightly doped upper surface of the first epitaxial layer 302 may serve as an etch stop during the etching process. The first epitaxial layer 302 may have a higher dopant concentration in areas closer to the substrate 202 to allow for lateral electric conductivity.

The etching process may be the same one used to define the mesa shown in FIG. 4A. In other cases, an additional etching process may be performed after an removal of the substrate 202 as part of a vertical flip-chip process. The additional etching process may be used if the LED's dimensions are large relative to the lateral diffusion distances in the electrochemical reaction which are typically less than 100 microns.

After the dry etch exposes the upper surface of the first epitaxial layer 302, a metal contact 602 may be formed on the first epitaxial layer 302 using one or more of the deposition techniques described above. The metal contact 602 may enable the flow of current laterally through the doped regions of the first epitaxial layer 302 and subsequently through the epitaxial reflector 304 and other doped layers.

The metal contact 602 may be coupled to one terminal of a power supply 608 and the structure may be immersed in an electrolyte 602. In an example, the electrolyte may be an acidic solution. Another terminal of the power supply 608 may be connected to a platinum foil counter electrode 606, which may be immersed in the electrolyte 602 to complete a circuit. Energizing the circuit may cause an electrochemical reaction that selectively introduces microscopic voids (i.e., porosity) into layers that are highly doped with Si or Ge. The porosity may decrease the effective refractive index of these layers. This type of reaction may produce epitaxial reflectors with high electrical conductivity and may be preferable due to its relative simplicity of processing and its applicability to any structure, including micro-cavity LEDs that place the conducting epitaxial reflector 304 in close proximity to the QWs. This reaction is illustrated in FIG. 6B.

In this type of reaction, the structure and the platinum foil counter electrode 606 may be immersed in an electrolyte 602 of a 15M nitric acid solution. A direct current may be applied through the platinum foil counter electrode 606 and the metal contact 602, for example at a current density between 10 and 20 mA/cm$^2$. Optional ultra-violet (UV) illumination may be supplied by a 250 W mercury lamp. Depending on the lateral dimension of the dry etch pattern, processing times of 10 to 60 minutes may be required after which the lamp and the current source are switched off. Platinum may be applied directly over the surface of the structure to make an electrical contact to the semiconductor surface and various different solutions such as NaOH, KOH, oxalic acid, nitrilotriacetic acid, or $CH_3OH$—HF—$H_2O_2$ may be used in the electrochemical or photo-electrochemical process.

Another type of reaction may selectively oxidize nitride layers of higher Al mole fraction and may convert them into oxide or oxy-nitride layers of lower refractive index than the as-grown material. In an example, the electrolyte 602 used may be a basic solution. This reaction is illustrated in FIG. 6C.

This type of reaction may be suitable in implementations where electrical conductivity of the reflector is not important. Due to the limited electrical conductivity of oxy-nitride materials, this approach may require bonding the p-type layer 208 to a carrier, removing the substrate 202 and dry etching trenches through the first epitaxial layer 302 from the back side to expose the epitaxial reflector 304. The back side of the wafer would then be subjected to an electrochemical process. A second trench may be etched from the opposite side of the structure to access electrically conducting GaN layers positioned in between the epitaxial reflector 304 and the p-type electrode 402.

A reaction that causes roughening of the nitrogen-polarity crystal surfaces parallel to the substrate 202 that is exposed to the electrolyte may occur simultaneously with the reactions described above that occurs on the perpendicular crystal surfaces. Alternatively, roughening of the nitrogen polarity crystal surfaces to improve light extraction may be achieved in a separate processing step.

A transparent growth substrate and a dichroic mirror coating may be used to make a green LED device without the need of an epitaxial reflector. This method may be preferred for its simplicity in LED designs as all or part of the transparent growth substrate may remain attached in the finished product.

Figure 7A:
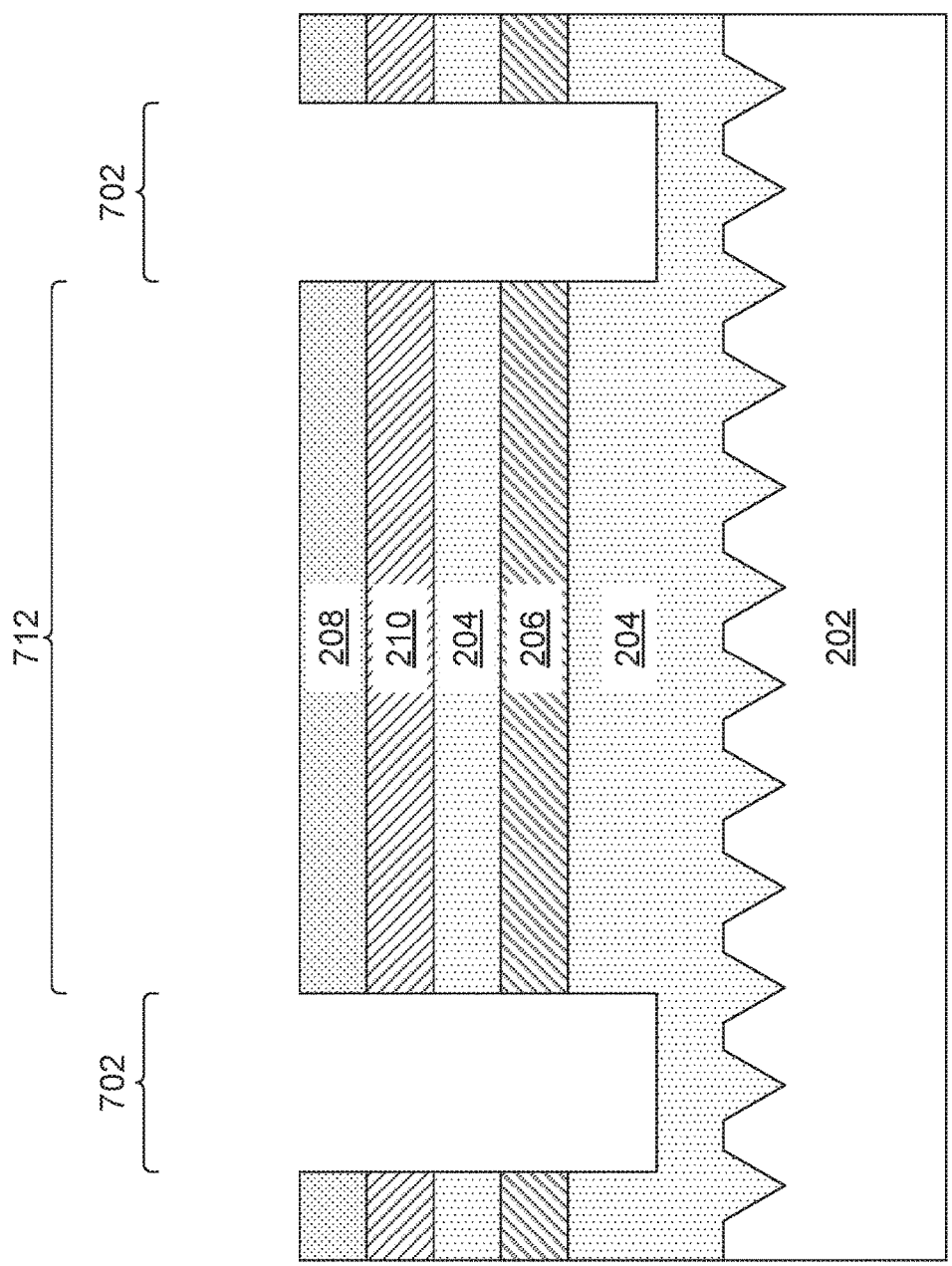
FIG. 7A is a cross section view illustrating forming trenches in the green LED utilizing PL of FIG. 2B to define an emitting region.

Referring now to FIGS. 7A-7E, cross section views illustrating forming an LED device are shown. FIG. 7A shows forming trenches 702 in the green LED utilizing PL of FIG. 2B is shown. As described above, the substrate 202 may be a transparent growth substrate and may be a patterned sapphire substrate. As described above, a nucleation layer (not shown) may be formed on the patterned side of substrate 202 prior to the formation of the n-type layer 204. The nucleation layer may comprise GaN or AlN. The side of the substrate 202 opposite of the patterned side may be grinded and polished to an optically smooth surface or surfaces.

The trenches 702 may be formed using a conventional directional etching process, such as dry etching. The trenches may extend through an entire thickness of the p-type layer 208, an entire thickness of the EL QW 210, an entire thickness of the underlying portion of the n-type layer 204 between the EL QW 210 and the PL QW 206, an entire thickness of the PL QW 206, and portion of the underlying n-type layer 204. The trenches 702 may define an emitting area 712.

Figure 7B:
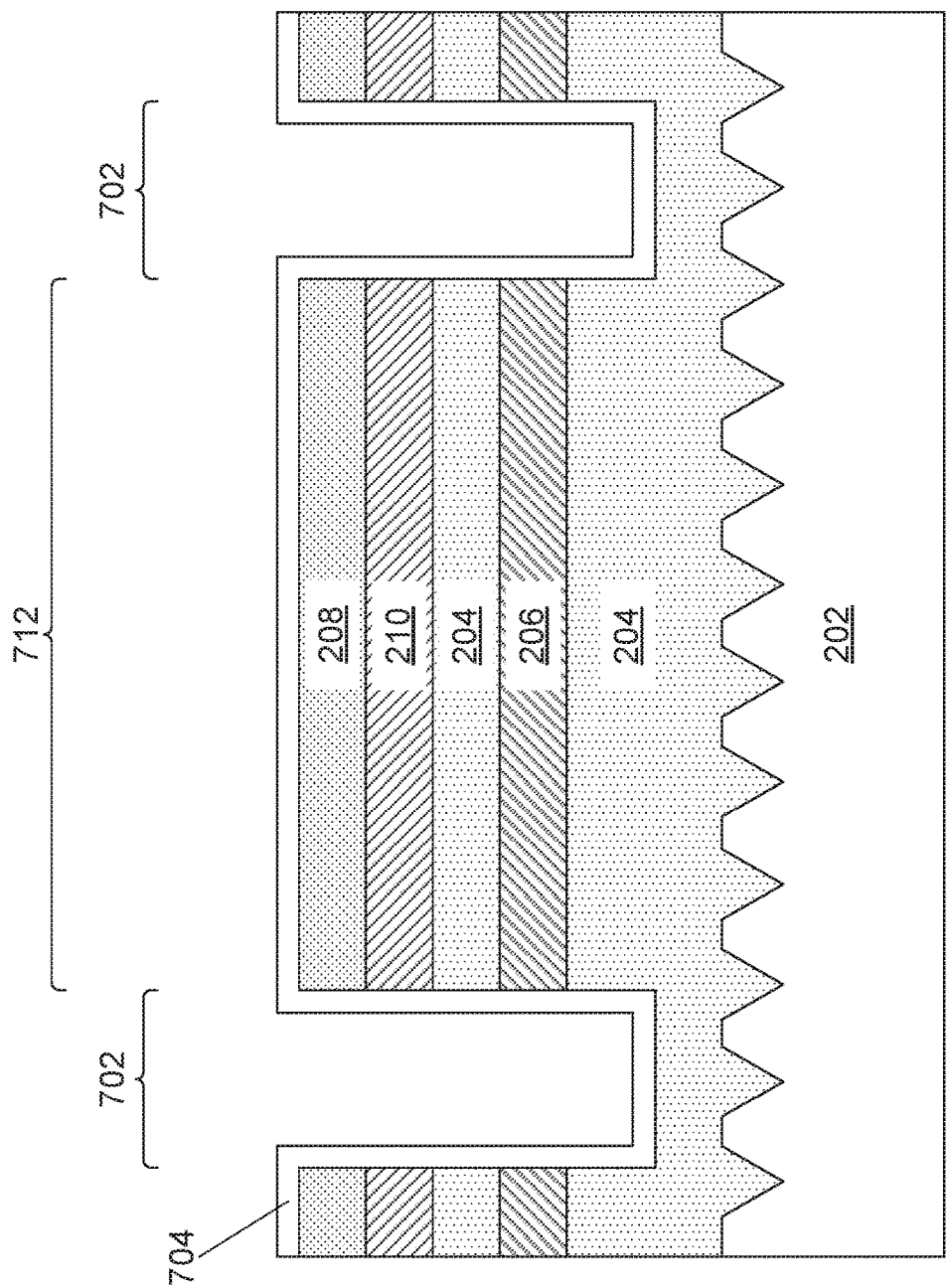
FIG. 7B is a cross section view illustrating forming a conformal dielectric passivation layer in the trenches and on the p-type layer.

FIG. 7B shows forming a conformal dielectric passivation layer 704 in the trenches 702 and on the p-type layer 208. The dielectric passivation layer 704 may be formed using a conventional deposition technique, such as, for example, CVD, PECVD, ALD, evaporation, sputtering, chemical solution deposition, spin-on deposition, or other like processes. The dielectric passivation layer 704 may comprise materials such as but not limited to $SiO_2$ or $SiN_x$.

Figure 7C:
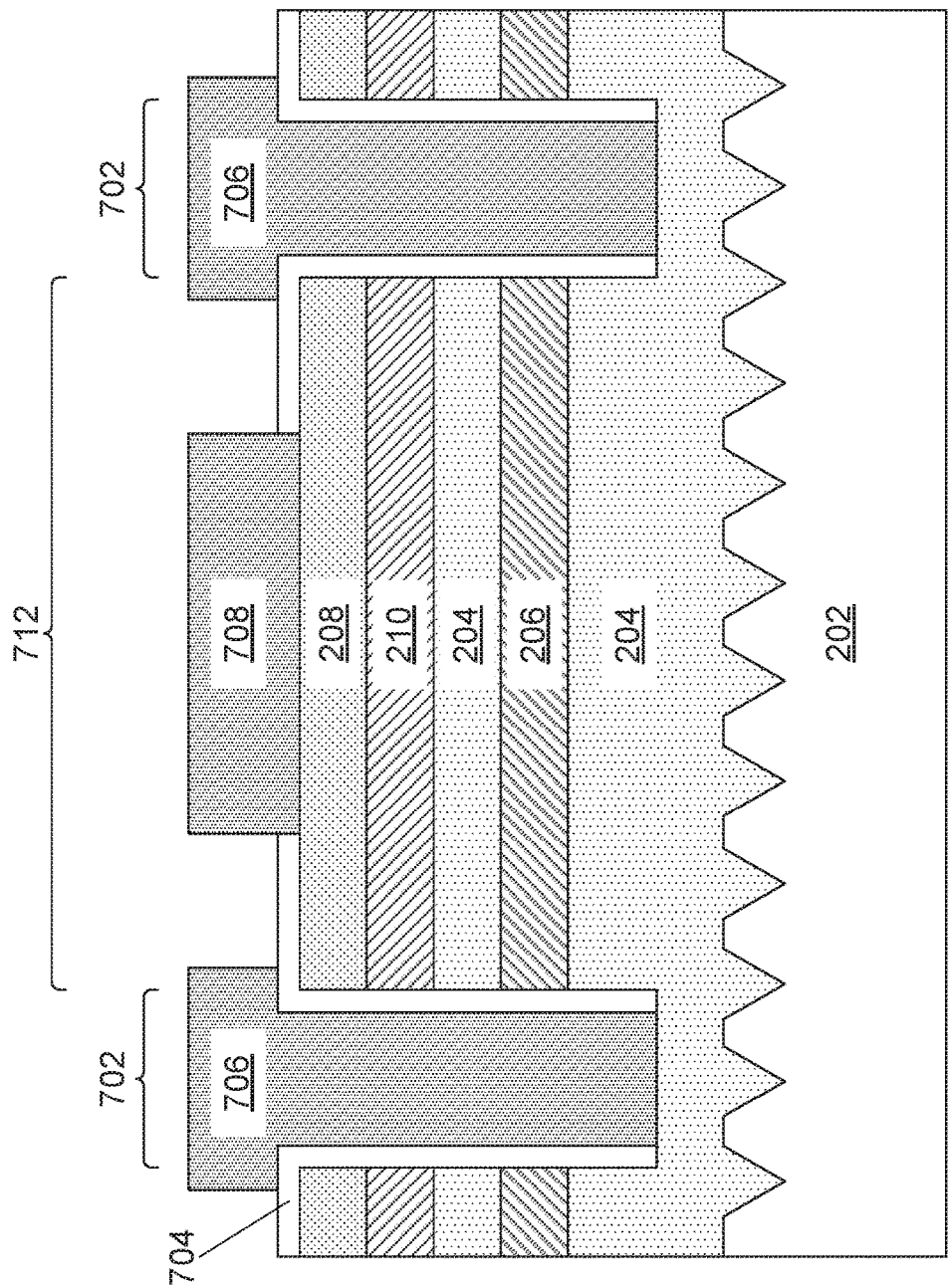
FIG. 7C is a cross section view illustrating forming n-type contacts in the trenches and a p-type contact on the p-type layer.

FIG. 7C shows forming n-type contacts 706 in the trenches 702 and a p-type contact 708 on the p-type layer 208. Portions of the dielectric passivation layer 704 may be removed from a bottom of the trenches 702 and the p-type layer 208 to expose the n-type layer 204 and the p-type layer 208. The portions of the dielectric passivation layer 704 may be removed using a conventional directional etching process, such as dry etching. The n-type contacts 706 and the p-type contact 708 may comprise one or more of a metal such as aluminum, silver, a metal stack, a sequence of transparent conducting oxide layers with different refractive indices, a series of dielectric layers with different refractive indices on top of a transparent conductive oxide layer, or combinations thereof. The n-type contacts 706 and the p-type contact 708 may be formed using a conventional deposition technique, such as, for example, CVD, PECVD, ALD, evaporation, sputtering, chemical solution deposition, spin-on deposition, or other like processes.

FIG. 7D shows forming a dichroic mirror 710 a bottom surface of the substrate 202 to form the LED device. The dichroic mirror 710 may comprise a stack of dielectric layers with a large difference in refractive index. For example, the dichroic mirror 710 may comprise $SiO_2$ and one or more of $TiO_2$, $ZrO_2$, and $HfO_2$. The dichroic mirror 710 may be formed using one or more conventional techniques, such as atomic layer epitaxy, sputtering or e-beam evaporation.

The dichroic mirror 710 may have a thickness that is ¼ the peak wavelength of the shorter wavelength EL, but more complex coating designs are possible. The optimum dichroic mirror design for a specific device may depend on factors such as the geometry of the patterned sapphire and the amount of shorter-wavelength light permitted to escape from the device per application requirements. For white LED applications, the reflectivity of the dichroic mirror may be intentionally designed to be much lower than 100% to allow enough blue EL emission to escape to produce white light. As shown in FIG. 7D, light A emitted from the EL QW 210 may pass through the n-type layer 204, the PL QW 206, and the substrate 202 and may be reflected back by the dichroic mirror 710. The reflected light A may then enter the PL QW 206 and be emitted as light B, which may pass through the n-type layer 204, the substrate 202, and the dichroic mirror 710.

Figure 7E:
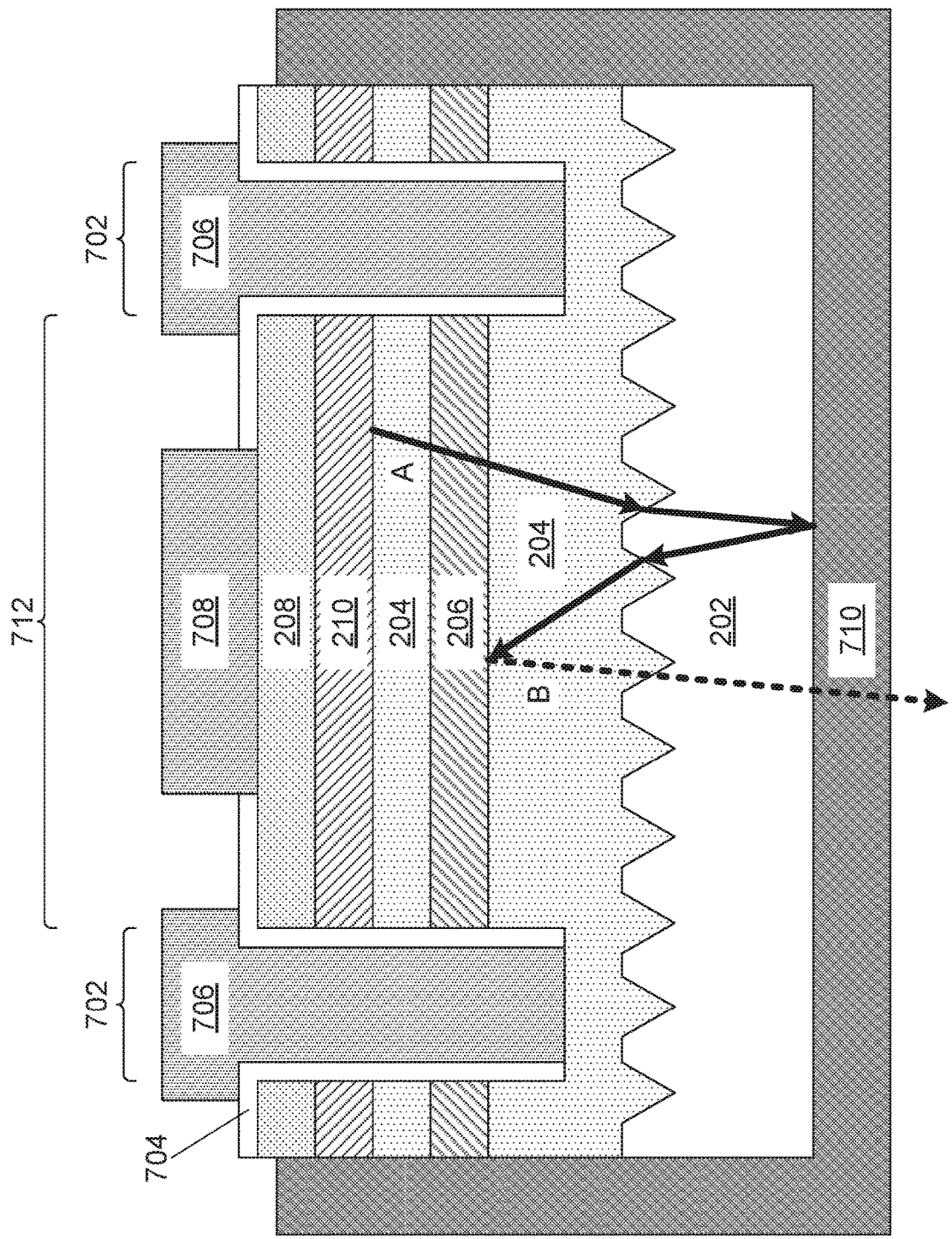
FIG. 7E is a cross section view illustrating forming a dichroic mirror on a bottom surface and sides of the LED device.

FIG. 7E, shows another example of forming the dichroic mirror 710 such that it extends to sides of the LED device. The dichroic mirror 710 may be formed using one or more conventional conformal deposition techniques, such as atomic layer epitaxy, sputtering or e-beam evaporation. In addition to the bottom of the substrate 202, the dichroic mirror may be formed on one or more of: sidewalls of the p-type layer 208, sidewalls of the EL QW 210, sidewalls of the n-type layer 204, sidewalls of the PL QW 206, and sidewalls of the substrate 202.

Figure 8A:
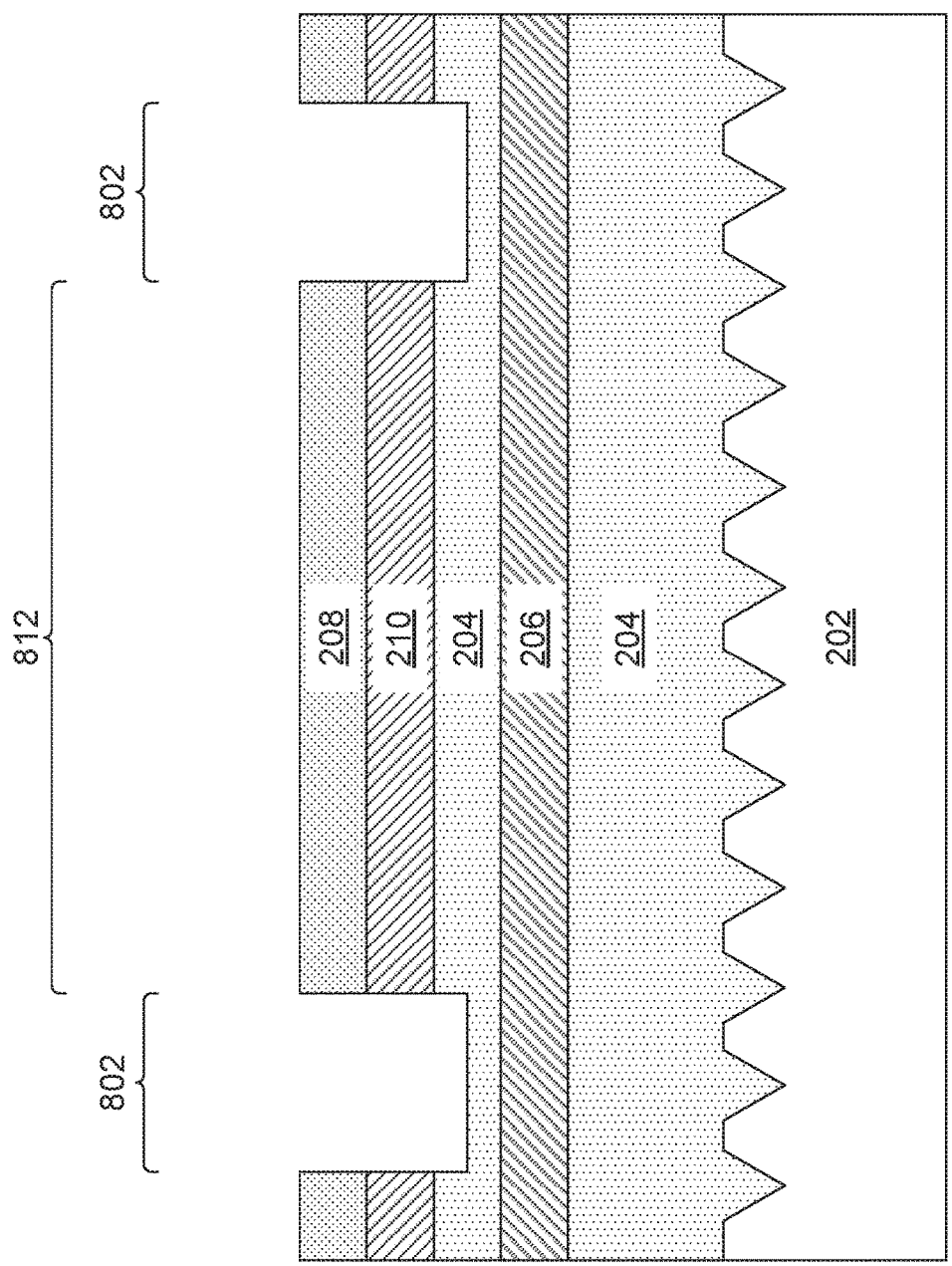
FIG. 8A is a cross section view illustrating forming trenches in the green LED utilizing PL of FIG. 2B to define an emitting region.

Referring now to FIGS. 8A-8E, cross section views illustrating forming an LED device are shown. FIG. 8A shows forming trenches 802 in the green LED utilizing PL of FIG. 2B is shown. As described above, the substrate 202 may be a transparent growth substrate and may be a patterned sapphire substrate. As described above, a nucleation layer (not shown) may be formed on the patterned side of substrate 202 prior to the formation of the n-type layer 204. The nucleation layer may comprise GaN or AlN. The side of the substrate 202 opposite of the patterned side may be grinded and polished to an optically smooth surface or surfaces.

The trenches 802 may be formed using a conventional directional etching process, such as dry etching. The trenches may extend through an entire thickness of the p-type layer 208 and an entire thickness of the EL QW 210, and may stop in the portion of the n-type layer 204 between the EL QW 210 and the PL QW 206. The trenches 802 may define an emitting area 812.

Figure 8B:
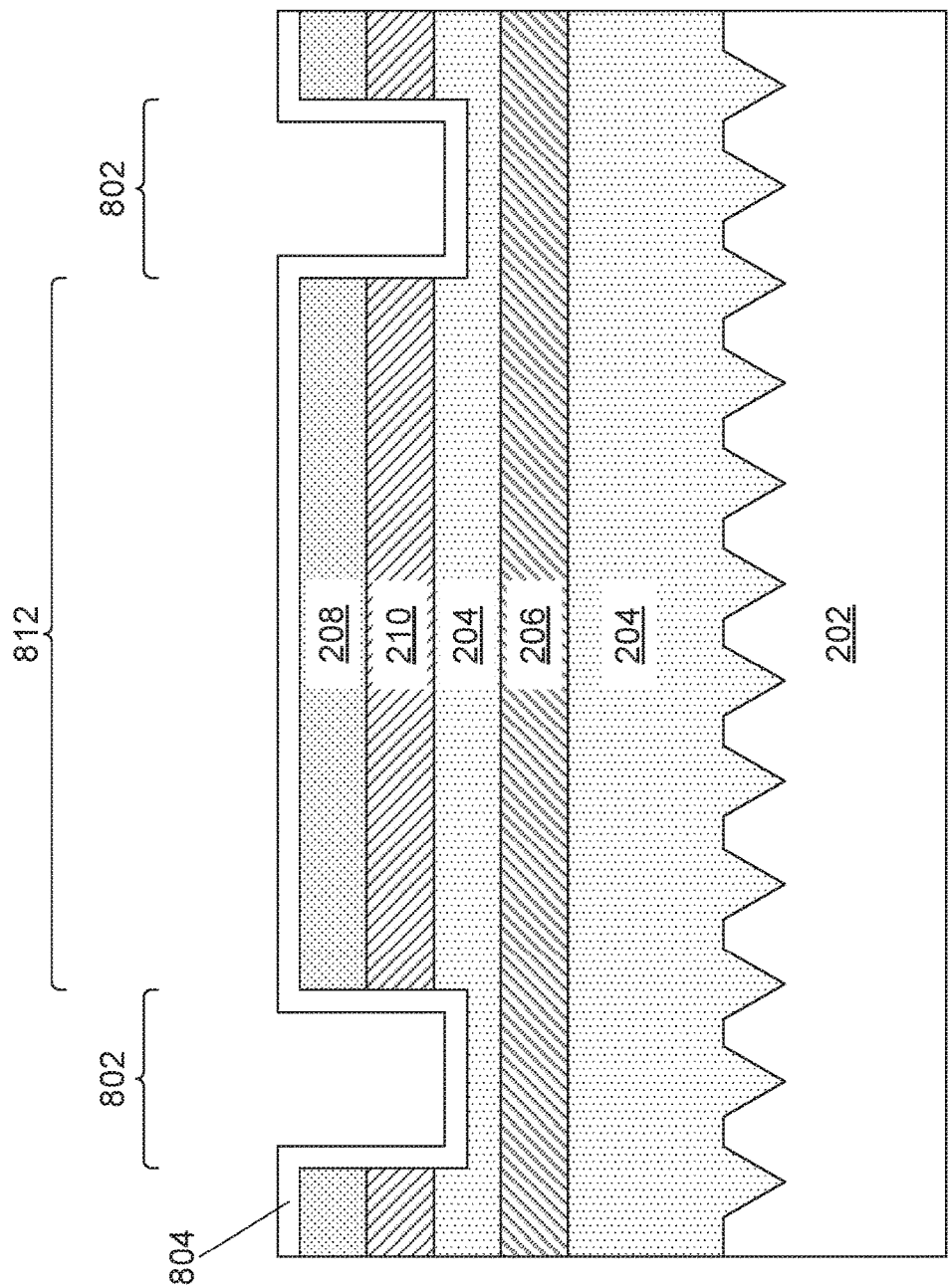
FIG. 8B is a cross section view illustrating forming a conformal dielectric passivation layer in the trenches and on the p-type layer.

FIG. 8B shows forming a conformal dielectric passivation layer 804 in the trenches 802 and on the p-type layer 208. The dielectric passivation layer 804 may be formed using a conventional deposition technique, such as, for example, CVD, PECVD, ALD, evaporation, sputtering, chemical solution deposition, spin-on deposition, or other like processes. The dielectric passivation layer 804 may comprise materials such as but not limited to $SiO_2$ or $SiN_x$.

Figure 8C:
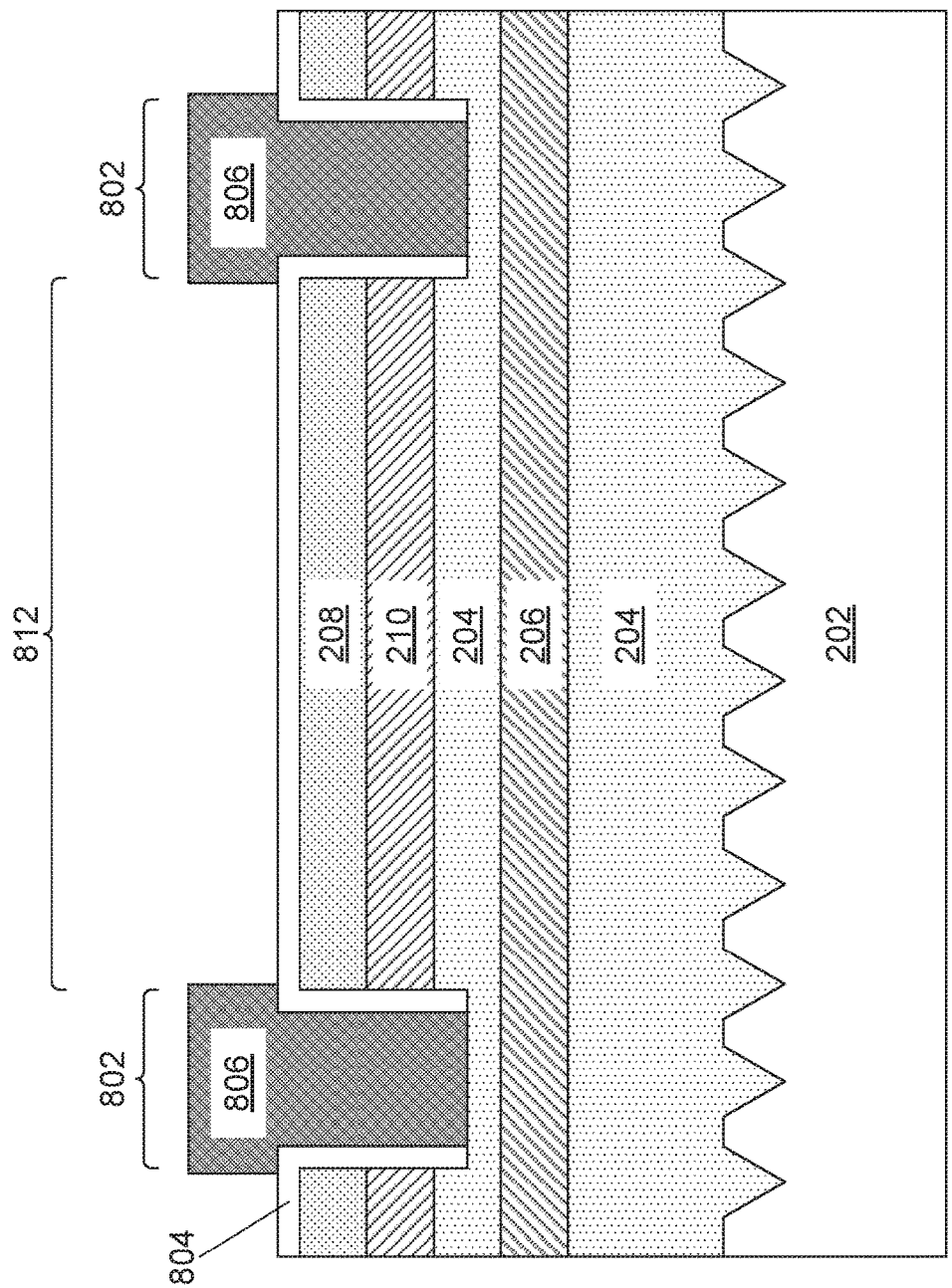
FIG. 8C is a cross section view illustrating forming n-type contacts in the trenches and a p-type contact on the p-type layer.

FIG. 8C shows forming n-type contacts 806 in the trenches 802 and a p-type contact 808 on the p-type layer 208. Portions of the dielectric passivation layer 804 may be removed from a bottom of the trenches 802 and the p-type layer 208 to expose the n-type layer 204 and the p-type layer 208. The portions of the dielectric passivation layer 804 may be removed using a conventional directional etching process, such as dry etching. The n-type contacts 806 and the p-type contact 808 may comprise one or more of a metal such as aluminum, silver, a metal stack, a sequence of transparent conducting oxide layers with different refractive indices, a series of dielectric layers with different refractive indices on top of a transparent conductive oxide layer, or combinations thereof. The n-type contacts 806 and the p-type contact 808 may be formed using a conventional deposition technique, such as, for example, CVD, PECVD, ALD, evaporation, sputtering, chemical solution deposition, spin-on deposition, or other like processes.

Figure 8D:
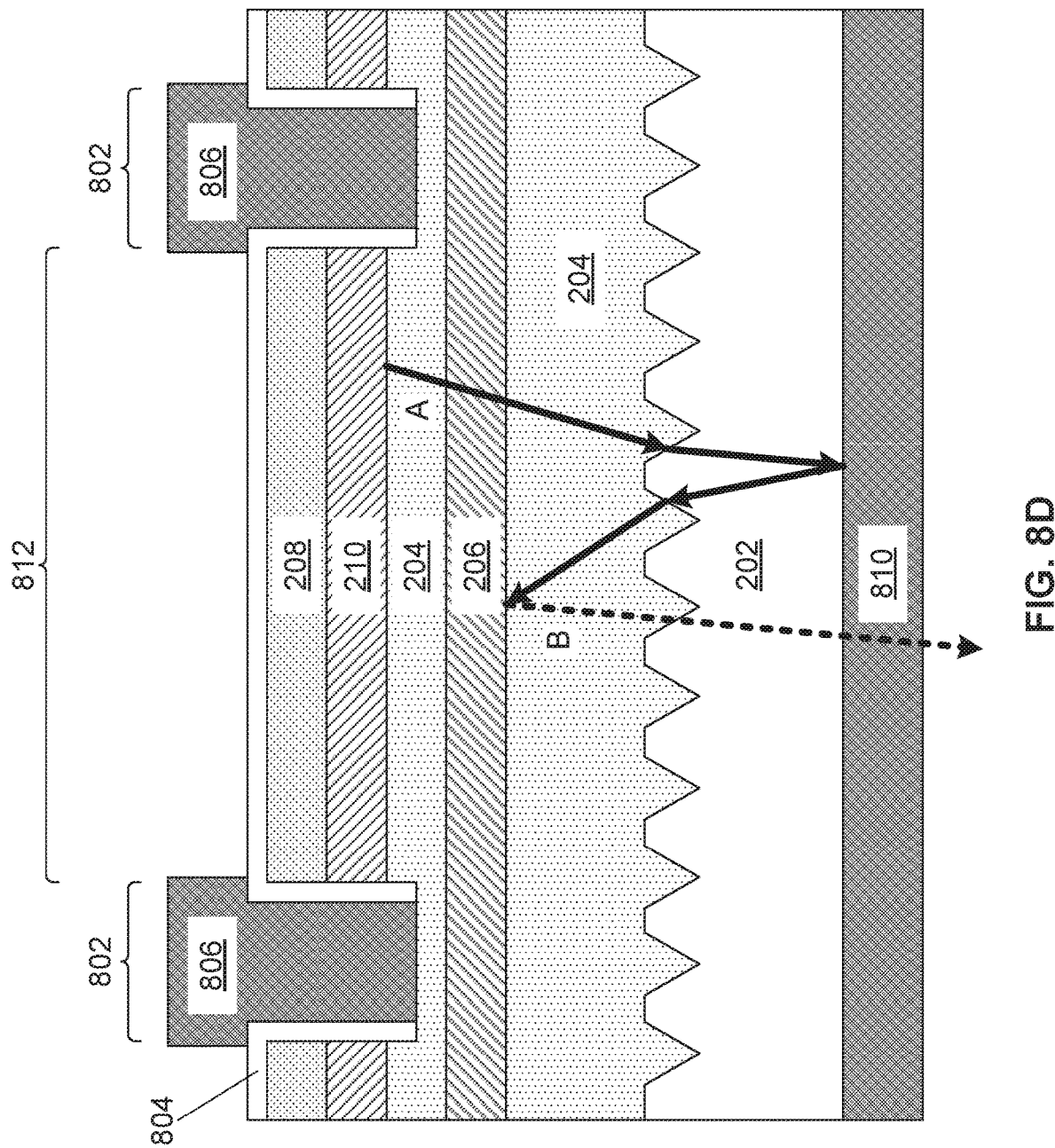
FIG. 8D is a cross section view illustrating forming a dichroic mirror on a bottom surface of the LED device.

FIG. 8D shows forming a dichroic mirror 810 on a bottom surface of the substrate 202 to form the LED device. The dichroic mirror 810 may comprise a stack of dielectric layers with a large difference in refractive index. For example, the dichroic mirror 810 may comprise $SiO_2$ and one or more of $TiO_2$, $ZrO_2$, and $HfO_2$. The dichroic mirror 810 may be formed using one or more conventional techniques, such as atomic layer epitaxy, sputtering or e-beam evaporation.

The dichroic mirror 810 may have a thickness that is ¼ the peak wavelength of the shorter wavelength EL, but more complex coating designs are possible. The optimum dichroic mirror design for a specific device may depend on factors such as the geometry of the patterned sapphire and the amount of shorter-wavelength light permitted to escape from the device per application requirements. For white LED applications, the reflectivity of the dichroic mirror may be intentionally designed to be much lower than 100% to allow enough blue EL emission to escape to produce white light. As shown in FIG. 8D, light A emitted from the EL QW 210 may pass through the n-type layer 204, the PL QW 206, and the substrate 202 and may be reflected back by the dichroic mirror 810. The reflected light A may then enter the PL QW 206 and be emitted as light B, which may pass through the n-type layer 204, the substrate 202, and the dichroic mirror 810.

Figure 8E:
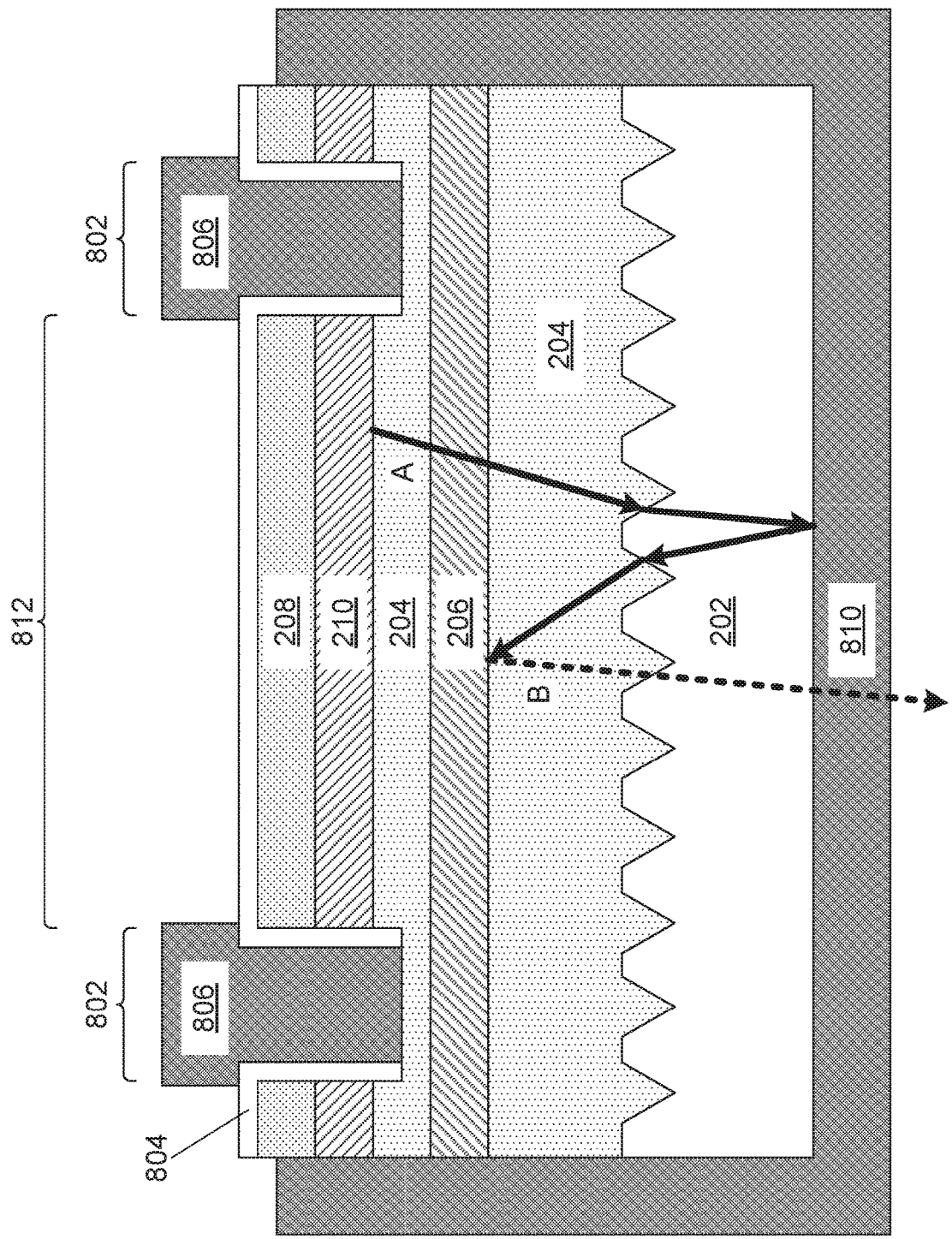
FIG. 8E is a cross section view illustrating forming a dichroic mirror on a bottom surface and sides of the LED device.

FIG. 8E, shows another example of forming the dichroic mirror 810 such that it extends to sides of the LED device. The dichroic mirror 810 may be formed using one or more conventional conformal deposition techniques, such as atomic layer epitaxy, sputtering or e-beam evaporation. In addition to the bottom of the substrate 202, the dichroic mirror may be formed on one or more of: sidewalls of the p-type layer 208, sidewalls of the EL QW 210, sidewalls of the n-type layer 204, sidewalls of the PL QW 206, and sidewalls of the substrate 202.

Figure 9A:
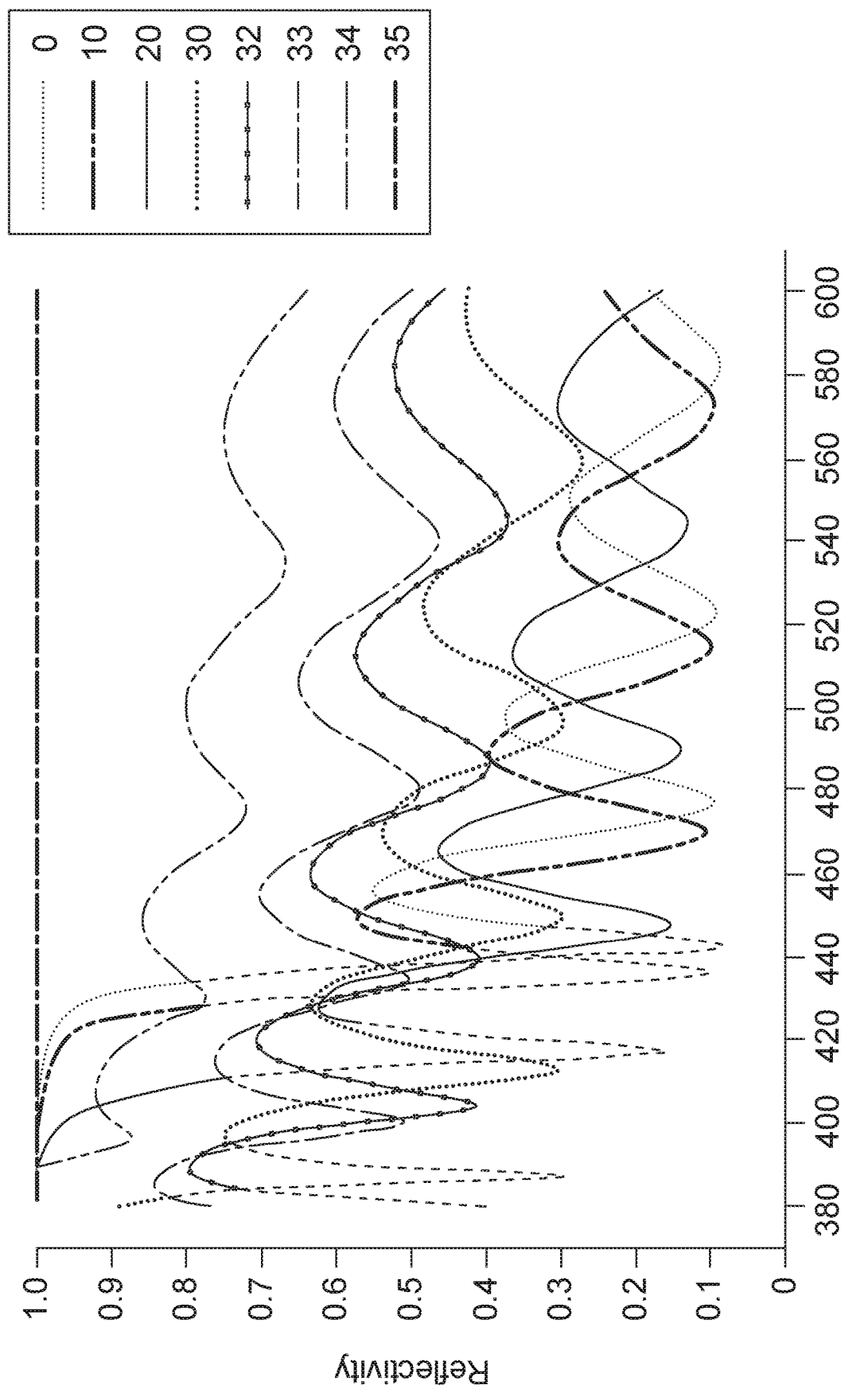

Referring now to FIGS. 9A-9B, charts illustrating reflectivity of the LED device of FIGS. 7A-8D over different angles of incidence for different wavelengths of light are shown. FIG. 9A shows reflectivity from the substrate 202 side of the LED with a dichroic mirror 710 comprising 12 repetitions of a 51 nm thick layer of $ZrO_2$ and a 67 nm thick layer of $SiO_2$ as well as a 90 nm thick layer of $ZrO_2$. FIG. 9B shows reflectivity from the substrate 202 side of the LED with a dichroic mirror 710 comprising 4 repetitions of a 53 nm thick layer of $ZrO_2$ and a 69 nm thick layer of $SiO_2$ as well as a 60 nm thick layer of $ZrO_2$. The dichroic mirror 710 may maintain higher reflectivity over a wider range of angles for transverse-electric (TE) polarized light. The reflectivity responses in FIGS. 9A-9B are shown for the case of 90% TE polarized light.

Figure 10:
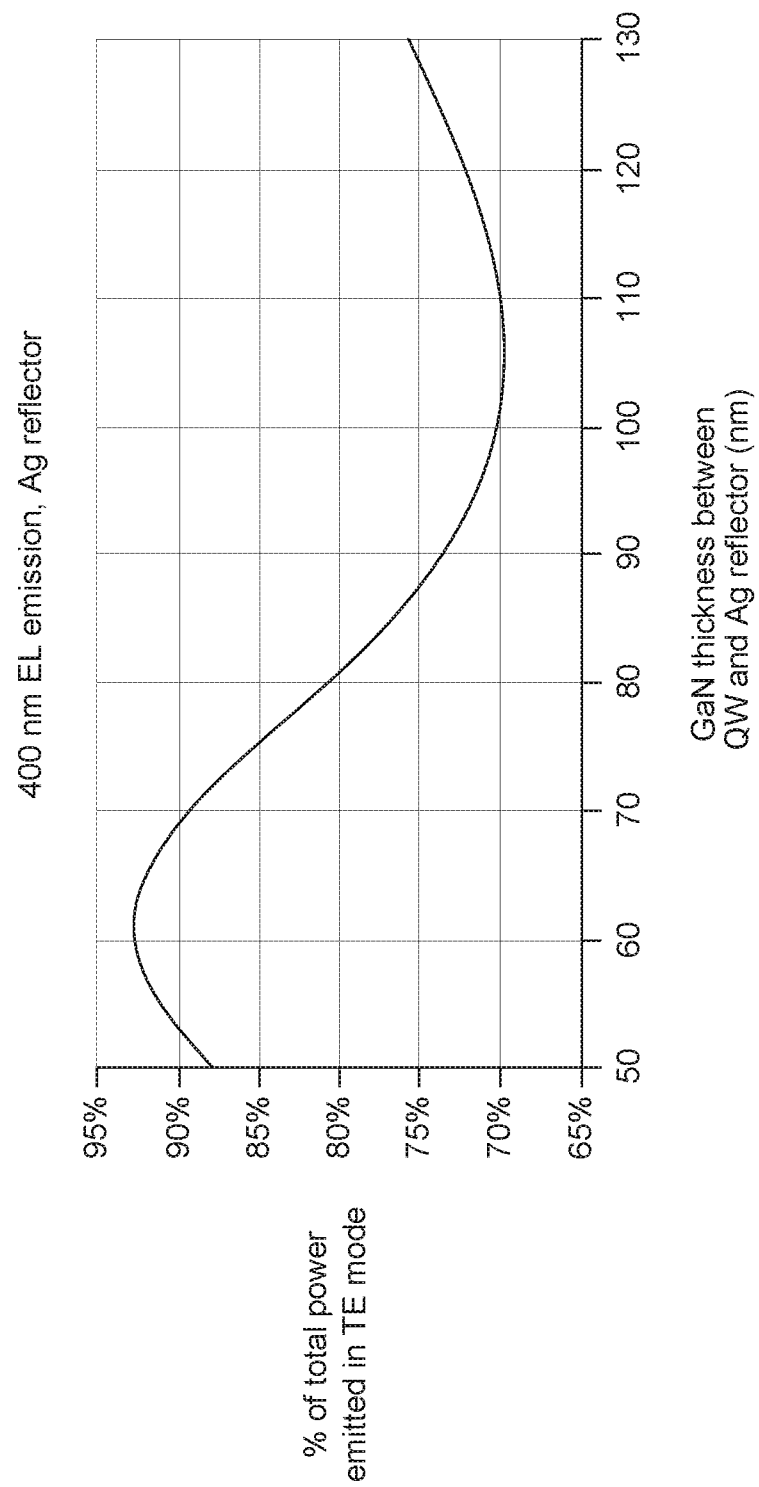
FIG. 10 is a chart illustrating power emitted as a function of distance between the p-type contact and the EL QW.

Referring now to FIG. 10, a chart illustrating power emitted as a function of distance from the p-type contact 608 is shown. More specifically, FIG. 10 shows the calculated fraction of total electroluminescent power emitted with TE polarization for a 400 nm emitting QW as a function of its distance from a silver p-type contact 608. The thickness of the p-type layer 208 may be optimized to exploit self-interference of the EL emitting QWs. At the wavelength of 400 nm the fraction of EL power emitted with TE polarization may be maximized when the QWs are placed approximately at a distance equivalent to approximately 0.25 to approximately 0.45 times the peak wavelength of the EL emission in a p-type GaN (not the vacuum wavelength) from the p-type contact 608.

As described above, these methods and apparatuses may improve the wall-plug efficiency of high-power LEDs with applications including but not limited to micro-LED displays. The improvements may be most pronounced at higher current densities and longer wavelengths. The above description focuses mainly on green LEDs, but the techniques described above may be applied to blue LEDs (i.e., blue PL emitting QWs that are pumped by shorter WL EL emitting QWs) when driving current densities are sufficiently high. The techniques described above may be advantageous for direct color LEDs in which the color sensitivity to changes in injection current needs to be minimized. The color may be stable over a wide range of luminance levels. The techniques described above may be used in white LEDs with small form factors that do not include an external phosphor conversion material. These LEDs may find applications in smart automotive headlights and other products that use beam-steering technology based on LED arrays.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting diode (LED) device comprising:
a transparent substrate;
an n-type layer disposed on or above the transparent substrate;
an electroluminescent (EL) quantum well (QW) formed on the n-type layer and configured to emit a first light;
a photoluminescent (PL) QW formed in the n-type layer and configured to absorb at least a portion of the first light and in response emit a second light having a longer wavelength than the first light, the EL QW and the PL QW separated from one another by a portion of the n-type layer;
a p-type layer formed on the EL QW; and
a dichroic reflector having a greater reflectivity for the first light than for the second light, the dichroic reflector arranged to transmit the second light out of the LED device and to reflect back to the PL QW a portion of the first light transmitted through the PL QW and incident on the dichroic reflector.

2. The LED device of claim 1, wherein the PL QW comprises multiple QWs emitting a same wavelength of light.

3. The LED device of claim 1, wherein the EL QW comprises multiple QWs emitting a same wavelength of light.

4. The LED device of claim 1, wherein the PL QW is adjacent to a depletion region of a p-n junction between the n-type layer and the p-type layer.

5. The LED device of claim 1, wherein the thickness of the p-type layer is optimized to exploit self-interference of the EL QW.

6. The LED device of claim 1, wherein the EL QW and the p-type electrode are separated by a distance equivalent to approximately 0.25 to approximately 0.45 times a peak wavelength of an emission of the EL QW in the p-type layer.

7. The LED device of claim 1, wherein the dichroic reflector is disposed on a surface of the transparent substrate opposite from the n-type layer.

8. The LED device of claim 7, wherein the dichroic reflector extends along one or more sidewalls of the transparent substrate, n-type layer, EL QW, and p-type layer.

9. The LED device of claim 7, wherein the dichroic reflector comprises a stack of dielectric layers having different refractive indices.

10. The LED device of claim 1, wherein the dichroic reflector has a thickness of approximately one quarter of a peak wavelength of light emitted by the EL QW.

11. The LED device of claim 1, wherein EL QW is located within a depletion region of a p-n junction between the n-type layer and the p-type layer.

12. The LED device of claim 7, further comprising
trenches formed through at least an entire thickness of the p-type layer and an entire thickness of the EL QW to expose the n-type layer, the trenches defining an emitting area;
a passivation material formed on sidewalls of the trenches and an upper surface of the p-type layer;
n-type contacts formed in the trenches; and
a p-type contact formed on the upper surface of the p-type layer in the emitting area.

13. The LED device of claim 1, wherein the dichroic reflector is disposed between the transparent substrate and the n-type layer.

14. The LED device of claim 13, wherein the dichroic reflector comprises multiple layers of Group III-V semiconductor materials having different compositions.

15. The LED device of claim 14, wherein one or more of the multiple layers of Group III-V semiconductor materials are oxidized such that they have a lower refractive index than as-grown material.

16. The LED device of claim 14, wherein one or more of the multiple layers of Group III-V semiconductor materials comprise dopants of one or more of Si and Ge and are processed to include voids such that they have a lower refractive index than as-grown material.

17. The LED device of claim 14, further comprising:
a first epitaxial layer formed on the substrate between the substrate and the dichroic reflector; and
a second epitaxial layer formed between the dichroic reflector and the n-type layer.

18. The LED device of claim 1 wherein the PL QW is configured to emit green light.

19. The LED device of claim 1 comprising a second PL QW formed in the n-type layer and configured to absorb at least a portion of the first light and in response emit a third light having a longer wavelength than the first light, the PL QW and the second PL QW separated from one another by a portion of the n-type layer.

20. The LED device of claim 19 wherein the second PL QW is configured to emit red light.

21. The LED device of claim 20 wherein the PL QW is configured to emit green light.

* * * * *